(12) United States Patent
Kido et al.

(10) Patent No.: US 9,111,834 B2
(45) Date of Patent: Aug. 18, 2015

(54) SOLID-STATE IMAGING DEVICE AND ELECTRONIC APPARATUS

(71) Applicant: Sony Corporation, Tokyo (JP)

(72) Inventors: Hideo Kido, Kanagawa (JP); Atsuhiko Yamamoto, Kanagawa (JP); Akihiro Yamada, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/219,847

(22) Filed: Mar. 19, 2014

(65) Prior Publication Data

US 2014/0204255 A1 Jul. 24, 2014

Related U.S. Application Data

(63) Continuation of application No. 12/929,181, filed on Jan. 6, 2011, now Pat. No. 8,723,999.

(30) Foreign Application Priority Data

Jan. 28, 2010 (JP) .................................. 2010-017019

(51) Int. Cl.
*H04N 5/3745* (2011.01)
*H01L 27/146* (2006.01)
*H01L 27/148* (2006.01)

(52) U.S. Cl.
CPC ........ *H01L 27/14643* (2013.01); *H01L 27/148* (2013.01); *H01L 27/14603* (2013.01); *H01L 27/14641* (2013.01); *H04N 5/3745* (2013.01)

(58) Field of Classification Search
CPC ..... H04N 5/3745; H04N 5/378; H04N 3/155; H01L 27/14643; H01L 27/148; H01L 27/14603; H01L 27/14641
USPC .............. 348/294, 300, 301, 308; 250/208.1; 257/291

See application file for complete search history.

(56) References Cited

U.S. PATENT DOCUMENTS 7,244,920 B2 * 7/2007 Kim et al. .................. 250/208.1
7,294,873 B2 11/2007 Suzuki et al.
7,671,912 B2 3/2010 Abe et al.

(Continued)

FOREIGN PATENT DOCUMENTS

JP H10-256521 A 9/1998
JP 2003-031785 A 1/2003

(Continued)

OTHER PUBLICATIONS

Japanese Office Action issued Jul. 2, 2013 for corresponding Japanese Application No. 2010-017019.

(Continued)

*Primary Examiner* — Aung S Moe
(74) *Attorney, Agent, or Firm* — Fishman Stewart Yamaguchi PLLC

(57) ABSTRACT

A solid-state imaging device includes a pixel region in which shared pixels which share pixel transistors in a plurality of photoelectric conversion portions are two-dimensionally arranged. The shared pixel transistors are divisionally arranged in a column direction of the shared pixels, the pixel transistors shared between neighboring shared pixels are arranged so as to be horizontally reversed or/and vertically crossed, and connection wirings connected to a floating diffusion portion, a source of a reset transistor and a gate of an amplification transistor in the shared pixels are arranged along the column direction.

10 Claims, 24 Drawing Sheets

(56) References Cited

U.S. PATENT DOCUMENTS

| | | | |
|---|---|---|---|
| 7,812,878 B2 | 10/2010 | Kudoh | |
| 7,924,333 B2 | 4/2011 | Yin et al. | |
| 8,183,609 B2 | 5/2012 | Kudoh | |
| 8,638,379 B2* | 1/2014 | Kikuchi | 348/272 |
| 2003/0025160 A1 | 2/2003 | Suzuki et al. | |
| 2005/0280729 A1 | 12/2005 | Sekine | |
| 2006/0001751 A1 | 1/2006 | Abe et al. | |
| 2006/0038904 A1* | 2/2006 | Kudoh | 348/308 |
| 2006/0208163 A1* | 9/2006 | Manabe et al. | 250/208.1 |
| 2006/0280163 A1 | 12/2006 | Zhao et al. | |
| 2007/0158713 A1 | 7/2007 | Ohkawa | |
| 2008/0036888 A1* | 2/2008 | Sugawa et al. | 348/294 |
| 2008/0088724 A1* | 4/2008 | Kudoh | 348/300 |
| 2008/0180558 A1* | 7/2008 | Watanabe | 348/300 |
| 2008/0259178 A1* | 10/2008 | Oike | 348/222.1 |
| 2009/0046189 A1 | 2/2009 | Yin et al. | |
| 2009/0090845 A1* | 4/2009 | Yin et al. | 250/208.1 |
| 2009/0140304 A1 | 6/2009 | Kudoh | |
| 2009/0321800 A1 | 12/2009 | Ohkawa | |
| 2010/0225795 A1* | 9/2010 | Suzuki et al. | 348/300 |
| 2010/0245648 A1 | 9/2010 | Tayanaka et al. | |
| 2010/0253799 A1* | 10/2010 | Mabuchi | 348/222.1 |
| 2011/0025894 A1* | 2/2011 | Seko | 348/294 |
| 2011/0073751 A1* | 3/2011 | Ogino et al. | 250/208.1 |
| 2011/0102620 A1* | 5/2011 | Sakano et al. | 348/222.1 |
| 2011/0141333 A1* | 6/2011 | Naruse et al. | 348/308 |
| 2011/0181747 A1 | 7/2011 | Kido et al. | |
| 2011/0181749 A1 | 7/2011 | Yamada | |
| 2012/0026370 A1* | 2/2012 | Oike et al. | 348/298 |
| 2012/0049254 A1* | 3/2012 | Itonaga | 257/291 |
| 2012/0113290 A1* | 5/2012 | Nakata et al. | 348/222.1 |
| 2012/0133812 A1* | 5/2012 | Watanabe | 348/308 |
| 2012/0194723 A1* | 8/2012 | Ebihara | 348/308 |
| 2013/0002915 A1* | 1/2013 | Itonaga et al. | 348/300 |
| 2013/0049082 A1* | 2/2013 | Kato et al. | 257/292 |
| 2013/0313411 A1* | 11/2013 | Ui | 250/208.1 |
| 2014/0036115 A1* | 2/2014 | Mabuchi | 348/254 |
| 2014/0138523 A1* | 5/2014 | Ogino et al. | 250/208.1 |
| 2014/0184864 A1* | 7/2014 | Itonaga et al. | 348/300 |
| 2014/0204255 A1* | 7/2014 | Kido et al. | 348/300 |
| 2014/0211053 A1* | 7/2014 | Kido et al. | 348/300 |

FOREIGN PATENT DOCUMENTS

| | | |
|---|---|---|
| JP | 2004-172950 | 6/2004 |
| JP | 2005-157953 | 6/2005 |
| JP | 2005-223860 | 8/2005 |
| JP | 2006-054276 | 2/2006 |
| JP | 2006-073733 A | 3/2006 |
| JP | 2008-218648 A | 9/2008 |
| JP | 2009-010862 A | 1/2009 |
| JP | 2009-135319 | 6/2009 |
| JP | 2011-155596 A | 8/2011 |

OTHER PUBLICATIONS

Chinese Office Action issued Jul. 1, 2014 for corresponding Chinese Application No. 201110023676.9.

Japanese Office Action issued Feb. 17, 2015 for corresponding Japanese Application No. 2014-091203.

* cited by examiner

211

SOLID-STATE IMAGING DEVICE AND ELECTRONIC APPARATUS

CROSS REFERENCES TO RELATED APPLICATIONS

This is a Continuation application of U.S. patent application Ser. No. 12/929,181, filed on Jan. 6, 2011, which claims priority from Japanese Patent Application 2010-017019, filed on Jan. 28, 2010, the entire contents of which being incorporated herein by reference.

BACKGROUND OF THE INVENTION

1. Field of the Invention

The present invention relates to a CMOS type solid-state imaging device and an electronic apparatus including the solid-state imaging device, which is applicable to, for example, a camera or the like.

2. Description of the Related Art

As a solid-state imaging device, a CMOS solid-state imaging device is known. Since the CMOS solid-state imaging device has a low power supply voltage and low power consumption, the CMOS solid-state imaging device is used in digital still cameras, digital video cameras, various mobile terminals such as a mobile phone including a camera therein, printers, and the like.

In the CMOS solid-state imaging device, a pixel arranged in a pixel region includes a plurality of pixel transistors in addition to photodiodes PD which are photoelectric conversion portions, unlike a CCD solid-state imaging device. In a general unit pixel, the pixel transistor includes four transistors, namely, a transfer transistor including a floating diffusion portion FD which is a voltage conversion portion, a reset transistor, an amplification transistor and a selection transistor. Alternatively, the pixel transistor includes three transistors, namely, a transfer transistor, a reset transistor and an amplification transistor omitting the selection transistor. Since the photodiodes and the plurality of pixel transistors are necessary as the unit pixel, it is difficult to reduce the size of the pixels.

However, recently, a technology necessarily including a so-called multi-pixel shared structure of sharing the pixel transistors among a plurality of pixels so as to suppress the size of an area occupied by one pixel other than the photodiode PD is used. FIG. 29 shows an example of a solid-state imaging device in which shared pixels are two-dimensionally arranged by the multi-pixel shared structure described in Japanese Unexamined Patent Application Publication No. 2006-54276. The solid-state imaging device 91 is a four-pixel shared example in which photodiodes PD are arranged in a zigzag. In the solid-state imaging device 91, sets of two obliquely neighboring photodiodes PD sharing one floating diffusion portion FD are two-dimensionally arranged. The shared pixels include four photodiodes PD1 to PD4 arranged in a zigzag by two sets neighboring in a vertical direction and two circuit groups (pixel transistors) in pixel transistor forming regions 114 divided at upper and lower positions of one set.

Transfer gate electrodes TG [TG1 to TG4] are formed between the floating diffusion portions FD and two photodiodes PD sandwiching the floating diffusion portions FD therebetween of two sets. In the shared pixels, the two sets are electrically connected to the two circuit groups in the pixel transistor regions 94 through a connection wiring 92 so as to share the four photodiodes PD1 to PD4 in the vertical direction. That is, the floating diffusion portions FD1 and FD2, a gate electrode (not shown) of the amplification transistor and a source (not shown) of the reset transistor are connected by the connection wiring 92 (so-called FD wiring) along the vertical direction.

The related art of the CMOS solid-state imaging device are disclosed in Japanese Unexamined Patent Application Publication Nos. 2004-172950, 2005-157953, 2009-135319, 2003-31785, and 2005-223860.

In the Japanese Unexamined Patent Application Publication Nos. 2004-172950 and 2005-157953, a CMOS solid-state imaging device in which two pixels are shared is disclosed.

In the Japanese Unexamined Patent Application Publication No. 2009-135319, a CMOS solid-state imaging device in which two pixels located in a vertical direction and two pixels located in a horizontal direction, namely, a total of four pixels are shared.

In the Japanese Unexamined Patent Application Publication No. 2003-31785, a back-illuminated type CMOS solid-state imaging device is disclosed.

In the Japanese Unexamined Patent Application Publication No. 2003-31785, a CMOS solid-state imaging device for performing vertical stripe correction is disclosed.

SUMMARY OF THE INVENTION

As the configuration of the shared pixel shown in FIG. 29, a configuration in which, among the pixel transistors divided as shown in FIG. 30, a reset transistor Tr2 is arranged on an upper side and a serial circuit of an amplification transistor Tr3 and a selection transistor Tr4 is arranged on a lower side is considered. The reset transistor Tr2 includes a reset gate electrode 106, a source region 104 and a drain region 105. The amplification transistor Tr3 has an amplification gate electrode 109, and configures diffusion regions 116 and 117 as a source region and a drain region. The selection transistor Tr4 has a selection gate electrode 118, and configures diffusion regions 115 and 116 as a source region and a drain region.

The reset transistor Tr2 and the serial circuit of the amplification transistor Tr3 and the selection transistor Tr4 are formed in the same layout in each column of the shared pixel. Tr11 to Tr14 denote transfer transistors. In the shared pixel of each column, the two floating diffusion portions FD1 and FD2, the amplification gate electrode 109 and the source region 104 of the reset transistor Tr2 are electrically connected by the FD lines 92A and 92B.

In the layout of the pixel transistors, in the amplification transistor Tr3, the gate length is preferably as long as possible from the viewpoint of random noise. The amplification transistor Tr3 and the selection transistor Tr4 have to be arranged at a constant interval d1.

The diffusion regions which become the source/drain regions of the serial circuit of the amplification transistor Tr3 and the selection transistor Tr4 have to be arranged at a constant interval d2 so as to be electrically isolated from the diffusion regions of the same serial circuit of the shared pixel of the neighboring column.

Whenever the array of the shared pixels is increased, symmetry between the shared photodiode PD and the serial circuit of the amplification and selection transistors is broken. As a result, the wiring length of the FD line 92A and 92B connecting the floating diffusion portions FD1 and FD2 is different in each column of the shared pixel as denoted by frames A and B of FIG. 30 and a difference in conversion efficiency between columns occurs. In terms of image quality, since a difference in sensitivity between columns appears, a vertical stripe occurs.

FIGS. 31 and 32 show an example of a longitudinal four-pixel shared type CMOS solid-state imaging device as another pixel shared type. In the solid-state imaging device 81 shown in FIG. 31, sets sharing two photodiodes PD neighboring in a vertical (longitudinal) direction and a floating diffusion portion FD are two-dimensionally arranged. The shared pixel is formed by arranging four longitudinally arranged photodiodes PD1 to PD4 of two sets neighboring in the vertical direction and pixel transistors corresponding to two pixel columns of a lower side of each set. Transfer transistors Tr11 to Tr14 are arranged in correspondence with the photodiodes PD1 to PD4.

Each transfer gate electrode TG is commonly formed with a transfer gate electrode of a neighboring column. In the pixel transistors arranged on a lower side of each set having two photodiodes PD, a serial circuit of an amplification transistor Tr3 and a selection transistor Tr4 and a reset transistor Tr2 are formed along a row direction. That is, in the shared pixel of neighboring columns, the serial circuit of the amplification transistor Tr3 and the selection transistor Tr4 and the reset transistor Tr2 are lined up and respectively arranged in the row direction. The FD lines 92A and 92B are arranged respectively in the shown layout. In FIG. 31, the portions corresponding to FIG. 30 are denoted by the same reference numerals and the description thereof will be omitted.

In the solid-state imaging device 82 shown in FIG. 32, the layout of the pixel transistors arranged on the lower side of each set having two photodiodes PD is different from FIG. 31. That is, only a serial circuit of an amplification transistor Tr3 and a selection transistor Tr4 is lined up and arranged on a lower side of one set in the same row direction and only a reset transistor Tr2 is lined up and arranged on a lower side of the other set in the same row direction. That is, in the shared pixel of neighboring columns, the serial circuit of the amplification transistor Tr3 and the selection transistor Tr4 and the reset transistor Tr2 are respectively arranged in the row direction in the same orientation. The FD lines 92A and 92B are respectively arranged in the shown layout. In FIG. 32, the portions corresponding to FIG. 30 are denoted by the same reference numerals and the description thereof will be omitted.

As shown in FIGS. 31 and 32, in the solid-state imaging devices 81 and 82, symmetry of the length of the FD lines 92A and 92B between columns is broken, a difference in conversion efficiency between columns occurs, and a difference in sensitivity between rows occurs.

If, for example, color filters of a Bayer array are used, in any of the solid-state imaging devices 100, 81 and 82 of FIGS. 30 to 32, since a Gb pixel and a pixel Gr which become green pixels are different in a region (area) overlapping with a gate electrode formed of polysilicon, a difference in light absorption of the gate electrode occurs and a sensitivity difference occurs.

It is desirable to provide a solid-state imaging device in which a sensitivity difference hardly occurs, in a solid-state imaging device having shared pixels.

In addition, it is desirable to provide an electronic apparatus including the solid-state imaging device, which is applicable to a camera or the like.

A solid-state imaging device according to an embodiment of the present invention includes a pixel region in which shared pixels which share pixel transistors in a plurality of photoelectric conversion portions are two-dimensionally arranged. The shared pixel transistors are divisionally arranged in a column direction of the shared pixels, and the pixel transistors shared between neighboring shared pixels are arranged so as to be horizontally reversed or/and vertically crossed. Connection wirings (so-called FD wirings) connected to a floating diffusion portion, a source of a reset transistor and a gate of an amplification transistor in the shared pixels are arranged along the column direction.

In the solid-state imaging device of the embodiment of the present invention, since the shared pixel transistors are divisionally arranged in the column direction of the shared pixels and the pixel transistors shared between the neighboring shared pixels are arranged so as to be horizontally reversed or/and vertically crossed, symmetry of every shared pixel including the FD wirings is improved. For example, the wiring lengths of the FD wirings between the neighboring shared pixels become equal, capacitance applied to the FD wirings becomes constant in each shared pixel, and a difference in photoelectric conversion efficiency hardly occurs. In the case of using color filters of the Bayer array, the area occupied by the gate electrodes included in the Gr pixel and the Gb pixel become equal. Light absorption amounts of the gate electrodes become equal and a difference in sensitivity between the Gr pixel and the Gb pixel hardly occurs.

An electronic apparatus according to another embodiment of the present invention includes a solid-state imaging device, an optical system configured to guide incident light to a photoelectric conversion portion of the solid-state imaging device, and a signal processing circuit configured to process an output signal of the solid-state imaging device. The solid-state imaging device includes a pixel region in which shared pixels which share pixel transistors in a plurality of photoelectric conversion portions are two-dimensionally arranged. The shared pixel transistors are divisionally arranged in a column direction of the shared pixels, and the pixel transistors shared between neighboring shared pixels are arranged so as to be horizontally reversed or/and vertically crossed. Connection wirings connected to a floating diffusion portion, a source of a reset transistor and a gate of an amplification transistor in the shared pixels are arranged along the column direction.

In the electronic apparatus of the present invention, since the solid-state imaging devices of the above-described embodiments of the present invention are included, a difference in sensitivity between the shared pixels hardly occurs.

According to the solid-state imaging device of the embodiment of the present invention, in the solid-state imaging device having shared pixels, it is possible to provide a solid-state imaging device having shared pixels between which a difference in sensitivity hardly occurs.

According to the electronic apparatus of the embodiment of the present invention, since the solid-state imaging device having shared pixels between which a difference in sensitivity hardly occurs is included, it is possible to obtain high quality and to provide an electronic apparatus with high reliability.

DESCRIPTION OF THE PREFERRED EMBODIMENTS

Hereinafter, modes (hereinafter, referred to as embodiments) carrying out the present invention will be described. The description will be given in the following order.

1. Schematic Configuration Example of CMOS Solid-state Imaging Device
2. Basic Configuration of Solid-state Imaging Device of Embodiment
3. First Embodiment (Configuration Example of Solid-state Imaging Device)
4. Second Embodiment (Configuration Example of Solid-state Imaging Device)
5. Third Embodiment (Configuration Example of Solid-state Imaging Device)
6. Fourth Embodiment (Configuration Example of Solid-state Imaging Device)
7. Fifth Embodiment (Configuration Example of Solid-state Imaging Device)
8. Sixth Embodiment (Configuration Example of Solid-state Imaging Device)
9. Seventh Embodiment (Configuration Example of Solid-state Imaging Device)
10. Eighth Embodiment (Configuration Example of Solid-state Imaging Device)
11. Ninth Embodiment (Configuration Example of Solid-state Imaging Device)
12. Tenth Embodiment (Configuration Example of Electronic Apparatus)

1. Schematic Configuration Example of CMOS Solid-State Imaging Device

Figure 1:
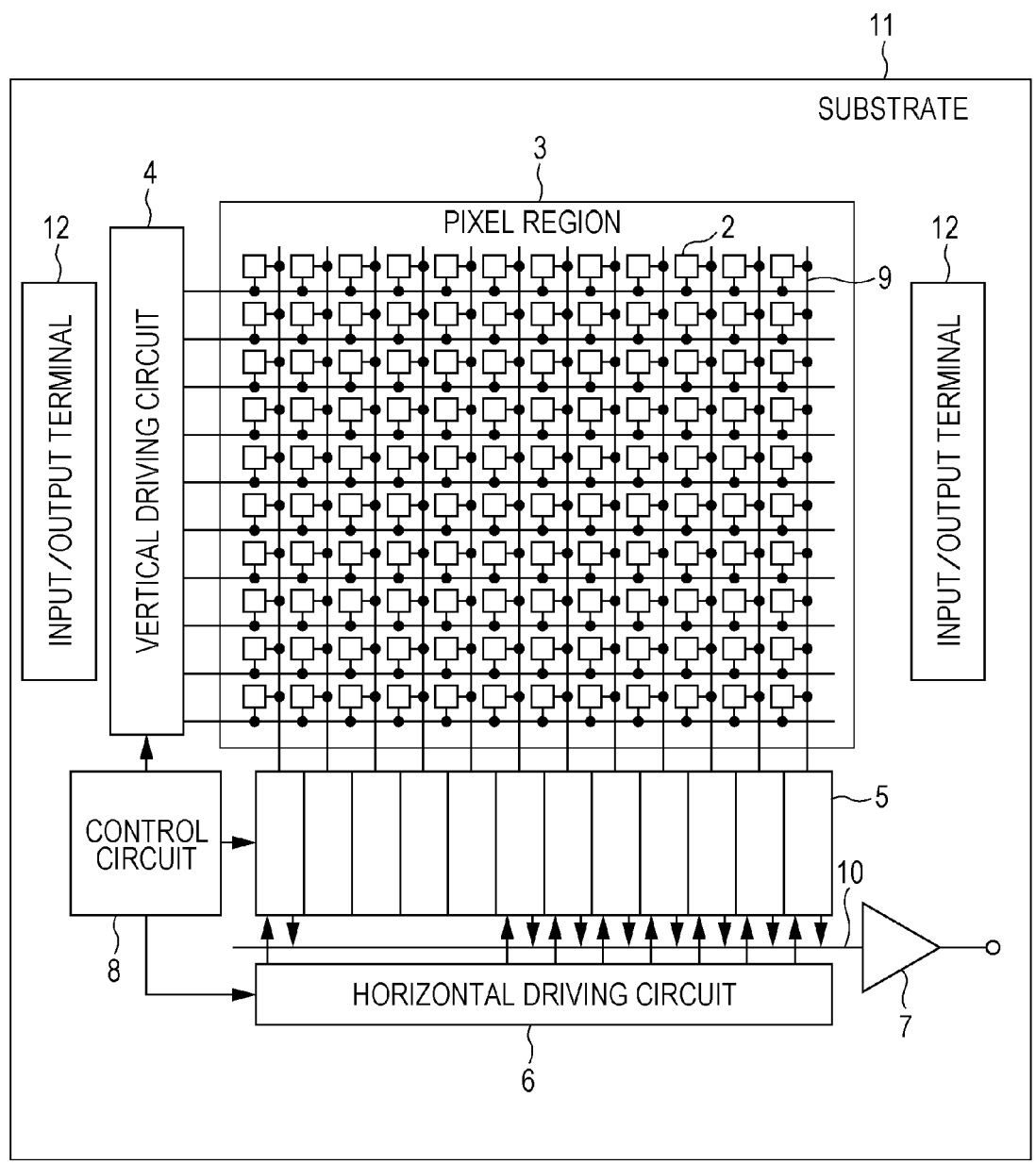
FIG. 1 is a schematic configuration diagram of a CMOS solid-state imaging device according to the present invention.

FIG. 1 shows the schematic configuration of an example of a CMOS solid-state imaging device according to each embodiment of the present invention. The solid-state imaging device 1 of the present example includes a pixel region (so-called imaging region) 3 in which a plurality of pixels 2 including photoelectric conversion portions is regularly and two-dimensionally arranged on a semiconductor substrate 11, for example, a silicon substrate, and a peripheral circuit portion, as shown in FIG. 1. As the pixels 2, shared pixels in which a plurality of photoelectric conversion portions share the other pixel transistors except a transfer transistor are used. The plurality of pixel transistors may include, for example, three transistors, namely a transfer transistor, a reset transistor and an amplification transistor or four transistors, namely, a transfer transistor, a reset transistor, an amplification transistor and a selection transistor.

The peripheral circuit portion includes a vertical driving circuit 4, column signal processing circuits 5, a horizontal driving circuit 6, an output circuit 7, a control circuit 8, and the like.

The control circuit 8 receives data for instructing an input clock, an operation mode, and the like and outputs data such as internal information of the solid-state imaging device. That is, the control circuit 8 generates a clock signal or a control signal which is used as a reference signal of an operation of the vertical driving circuit 4, the column signal processing circuits 5, the horizontal driving circuit 6, or the like according to a vertical synchronization signal, a horizontal synchronization signal and a master clock. Such a signal is input to the vertical driving circuit 4, the column signal processing circuits 5, the horizontal driving circuit 6, or the like.

The vertical driving circuit 4 includes a shift register, selects a pixel driving line, supplies a pulse signal for driving the pixels to the selected pixel driving line, and drives the pixels in row units. That is, the vertical driving circuit 4 sequentially selects the pixels 2 of the pixel region 3 in row units in a vertical direction. Pixel signals based on signal charges generated according to a light reception amount in, for example, photodiodes which are the photoelectric conversion elements of the pixels 2 are supplied to the column signal processing circuits 5 through vertical signal lines 9.

The column signal processing circuits 5 are arranged in, for example, every column of the pixel 2 so as to perform signal processing such as noise elimination with respect to the signal output from the pixels 2 corresponding to one row in each pixel column. That is, the column signal processing circuits 5 perform signal processing such as CDS, signal amplification, AD conversion, and the like, for eliminating inherent fixed pattern noise of the pixel 2. Horizontal selection switches (not shown) are connected between output stages of the column signal processing circuits 5 and horizontal signal lines 10.

The horizontal driving circuit 6 includes, for example, a shift register, sequentially outputs a horizontal scanning pulse so as to sequentially select the column signal processing circuits 5, and outputs the pixel signals from the column signal processing circuits 5 to horizontal signal lines 10.

The output circuit 7 performs signal processing with respect to the signals sequentially supplied from the column signal processing circuits 5 through the horizontal signal lines 10 and outputs the processed signals. For example, only buffering may be performed, black level adjustment, column deviation correction, a variety of digital signal processing, and the like may be performed. An input/output terminal 12 exchanges a signal with an external device.

In a front-illuminated type CMOS solid-state imaging device, a plurality of shared pixels which shares the pixel transistors in photodiodes PD, which are a plurality of photoelectric conversion portions, is formed in a first conductive type semiconductor well region, for example, p-type semiconductor well region corresponding to the pixel region of the semiconductor substrate. Each shared pixel is partitioned in an element isolation region. A multi-layer wiring layer having a plurality of wiring layers with an interlayer insulating films interposed therebetween is formed on a front surface side of the semiconductor substrate except on the photodiodes PD, and color filters and an on-chip lens are laminated and formed on the multi-layer wiring layer with a planarization film interposed therebetween. Light is irradiated to the photodiodes PD rather than the front surface side of the semiconductor substrate through the on-chip lens.

In a back-illuminated type CMOS solid-state imaging device, a plurality of shared pixels which shares the pixel transistors in photodiodes PD, which are a plurality of photoelectric conversion portions, is formed in a thinned semiconductor substrate, that is, a semiconductor substrate in which a first conductive type semiconductor well region, that is, a p-type semiconductor well region is formed. Each shared pixel is partitioned in an element isolation region. A multi-layer wiring layer having a plurality of wiring layers with an interlayer insulating film interposed therebetween is formed on one surface side of the semiconductor substrate, and a support substrate formed of a semiconductor substrate is adhered thereon. The wiring arrangement is not limited and the wiring is formed even on photodiodes PD. Color filters and the on-chip lens are laminated and formed on a rear surface side of the semiconductor substrate. Light is irradiated to the photodiodes PD rather than the rear surface side of the semiconductor substrate through the on-chip lens.

2. Basic Configuration of Solid-State Imaging Device of Embodiment

The solid-state imaging device according to the present embodiment, that is, the CMOS solid-state imaging device includes shared pixels sharing pixel transistors in a plurality of photoelectric conversion portions. The shared pixels are regularly and two-dimensionally arranged so as to form a pixel region. The pixel transistors are configured as a 3-transistor type including a transfer transistor, a reset transistor and an amplification transistor or a 4-transistor type further including a selection transistor in addition to the 3-transistor type. Among the pixel transistors of the shared pixels, the transfer transistor includes transfer transistors equal in number to the number of photoelectric conversion portions and each of the other shared pixel transistors. The shared pixel transistor, that is, the pixel transistors other than the transfer transistors are divided and arranged in a column direction of the shared pixels.

In the present embodiment, between neighboring shared pixels, for example, between shared pixels of neighboring columns or neighboring rows, the shared pixel transistors are horizontally reversed, are vertically crossed or are horizontally reversed and vertically crossed. A connection wiring, that is, an FD wiring, connected to a floating diffusion portion FD of each shared pixel, a source of a reset transistor and a gate of an amplification transistor is arranged along a column direction. A row direction denotes a direction along a row and a column direction denotes a direction along a column.

According to the solid-state imaging device according to the present embodiment, between neighboring shared pixels in which the pixel transistors shared within the shared pixels are divided and arranged in the column direction, the shared pixel transistors are arranged so as to be horizontally reversed and vertically crossed. By this configuration, symmetry of every shared pixel including the FD wiring of the shared pixel is improved, a difference in wiring length of the FD wiring disappears, and the wiring capacitance of the FD wiring becomes constant in every shared pixel. Accordingly, a difference in photoelectric conversion efficiency of every column or row hardly occurs and a difference in sensitivity between columns or rows disappears. As a result, in terms of image quality, a vertical stripe that is not a light amount of the photoelectric conversion portion until it is filled with charge, but that is a so-called sensitivity light amount, disappears.

In the case of using a color filter of the Bayer array, between neighboring shared pixels, by arranging the shared pixel transistors to be vertically crossed or to be horizontally reversed and to be vertically crossed, the occupied area of the base electrode overlapping a Gr pixel and a Gb pixel becomes equal. That is, the degree of light absorption by a gate electrode formed of a polysilicon becomes equal and a difference in sensitivity between the Gr pixel and the Gb pixel hardly occurs. Accordingly, it is possible to provide a solid-state imaging device with a plurality of shared pixels, in which a difference in sensitivity hardly occurs.

3. First Embodiment

Configuration Example of Solid-State Imaging Device

Figure 2:
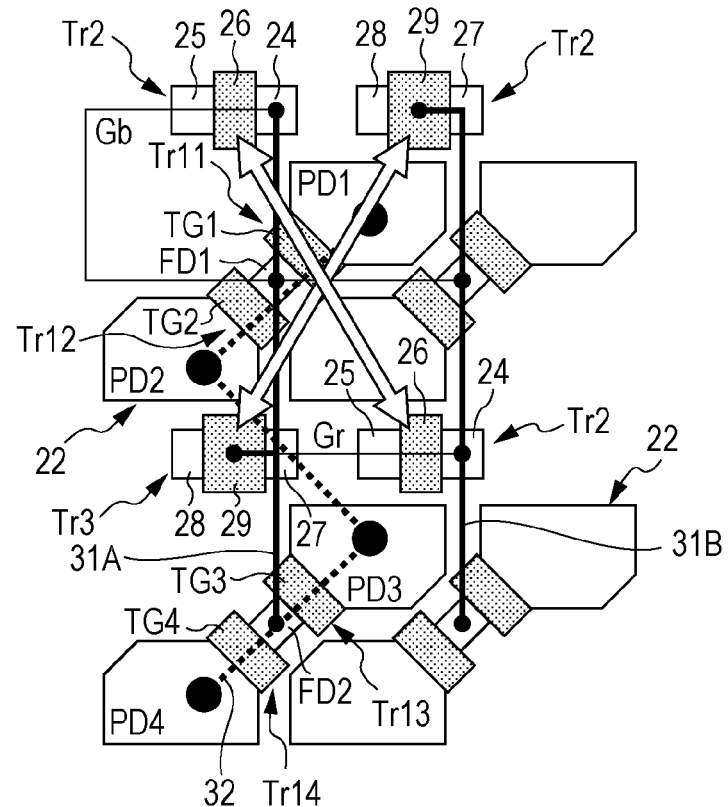
FIG. 2 is a configuration diagram of the main parts of a solid-state imaging device according to a first embodiment of the present invention.

FIG. 2 shows a solid-state imaging device, that is, a CMOS solid-state imaging device according to a first embodiment of the present invention. FIG. 2 shows the schematic configuration of main portions applied to the CMOS solid-state imaging device in which pixel transistors of the 3-transistor type are provided and a plurality of shared pixels having a zigzag 4-pixel shared structure is arranged. The present embodiment is characterized in the arrangement of the pixel transistors and will be described in comparison with a Comparative Example 1 of FIG. 3.

Figure 22:
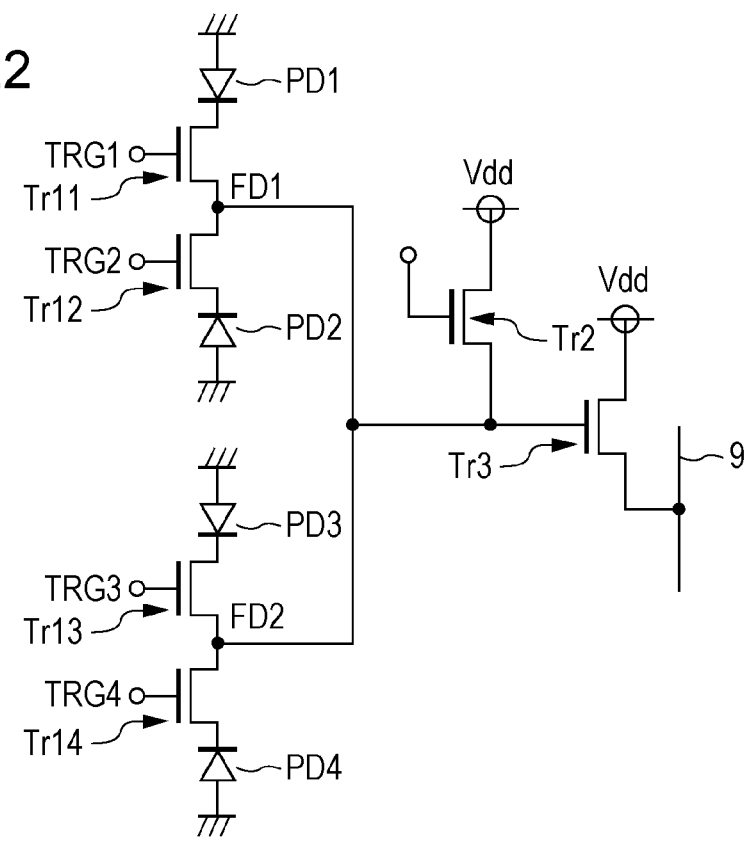
FIG. 22 is an equivalent circuit diagram of a 4-pixel shared structure of a 3-transistor type.

FIG. 22 shows an equivalent circuit of the shared pixels having the 4-pixel shared structure of the 3-transistor type. The shared pixels according to the present example include four photodiodes PD [PD1 to PD4] which are the photoelectric conversion portions, four transfer transistors Tr1 [Tr11 to Tr14], one reset transistor Tr2, and one amplification transistor Tr3. In the shared pixels, a first floating diffusion portion FD1 is shared between the two photodiodes PD1 and PD2 and a second floating diffusion portion FD2 is shared between two photodiodes PD3 and PD4.

The photodiodes PD1 to PD4 are connected to the transfer transistors Tr11 to Tr14, respectively. That is, two photodiodes PD1 and PD2 are connected to the first floating diffusion portion FD1 through the transfer transistors Tr11 and Tr12. Two photodiodes PD3 and PD4 are connected to the second floating diffusion portion FD2 through the transfer transistor Tr13 and Tr14. The first floating diffusion portion FD1 and the second floating diffusion portion FD2 are connected and the connection point is connected to a source of the reset transistor Tr2 and a gate of the amplification transistor Tr3. A drain of the reset transistor Tr2 is connected to a power source Vdd. A drain of the amplification transistor Tr3 is connected to the power source Vdd and a source thereof is connected to a vertical signal line 9.

First, a solid-state imaging device according to Comparative Example 1 of FIG. 3 will be described. In the solid-state imaging device 101 of Comparative Example 1, sets sharing one floating diffusion portion FD between two obliquely neighboring photodiodes PD are two-dimensionally arranged, and 4-pixel shared pixels 102 of the zigzag array are configured by two sets neighboring in a vertical (longitudinal) direction. That is, a first set sharing the first floating diffusion portion FD1 between two obliquely neighboring photodiodes PD1 and PD2 and a second set sharing the second floating diffusion portion FD2 between two obliquely neighboring photodiodes PD3 and PD4 are included. The first set and the second set are adjacently arranged in a longitudinal direction.

The transfer gate electrodes TG1 and TG2 are respectively formed between the photodiodes PD1 and PD2 and the first floating diffusion portion FD1 so as to form the first transfer transistor Tr11 and the second transfer transistor Tr12. The transfer gate electrodes TG3 and TG4 are respectively formed between the photodiodes PD3 and PD4 and the second floating diffusion portion FD2 so as to form the third transfer transistor Tr13 and the fourth transfer transistor Tr14.

In the shared pixels 102, the reset transistor Tr2 and the amplification transistor Tr3 are arranged to be divided vertically. That is, the reset transistor Tr2 including a source region 104, a drain region 105 and a reset gate electrode 106 is arranged on an upper side of a first set having the two photodiodes PD1 and PD2. In addition, an amplification transistor Tr3 including a source region 107, a drain region 108 and an amplification gate electrode 109 is arranged on an upper side of a second set having the two photodiodes PD3 and PD4. The reset transistor Tr2 and the amplification transistor Tr3 are arranged so as to be deviated from each other in a row (lateral) direction of the shared pixel 102.

Between the shared pixels neighboring in the row direction, that is, between the shared pixels 102 of the neighboring columns, the mutual amplification transistors Tr3 are lined up in the same direction and are arranged in the same row direction and the mutual reset transistors Tr2 are lined up in the same direction and arranged in the same row direction. In the shared pixel 102 of one of the neighboring columns, the source region 104 of the reset transistor, the amplification gate electrode 109 of the amplification transistor, the first floating diffusion portion FD1 and the second floating diffusion portion FD2 are connected by an FD wiring 111A. In the shared pixel 102 of the other of the neighboring columns, the source region 104 of the reset transistor, the amplification gate electrode 109 of the amplification transistor, the first floating diffusion portion FD1 and the second floating diffusion portion FD2 are connected by an FD wiring 111B. In the solid-state imaging device 101 of Comparative Example 1, the zigzag 4-pixel shared pixels 102 of the 3-transistor type are configured by the four photodiodes PD1 to PD4 of the zigzag array denoted by a broken line 112 and the pixel transistors Tr11 to Tr14, Tr2 and Tr3.

In the solid-state imaging device 101 according to Comparative Example 1, since the lengths of the FD wirings 111A and 111B of the shared pixels 102 of the neighboring columns are identical, there is no difference in conversion efficiency associated with the FD wiring length. However, in the configuration having the color filter of the Bayer array, as shown in FIG. 3, the Gb pixel includes the reset gate electrode 106 formed of polysilicon of the reset transistor Tr2 in the shared pixels (that is, unit cells) 102. The Gr pixel includes the amplification gate electrode 109 formed of polysilicon of the amplification transistor Tr3 in the shared pixels (unit cells) 102. The gate length of the amplification gate electrode 109 is greater than that of the reset gate electrode 106. The Gr pixel and the Gb pixel are the same green pixel, but include gate electrodes having different areas. Thus, a difference in light absorption between the Gr pixel and the Gb pixel occur due to the gate electrodes. As a result, a deviation in sensitivity between columns occurs and thus a vertical stripe occurs.

Next, the solid-state imaging device according to the first embodiment will be described. In the solid-state imaging device 21 of the first embodiment, as shown in FIG. 2, sets sharing one floating diffusion portion FD between two obliquely neighboring photodiodes PD are two-dimensionally arranged, and 4-pixel shared pixels 22 of the zigzag array are configured by two sets neighboring in a vertical direction. That is, a first set sharing the first floating diffusion portion FD1 between two obliquely neighboring photodiodes PD1 and PD2 and a second set sharing the second floating diffusion portion FD2 between two obliquely neighboring photodiodes PD3 and PD4 are adjacently arranged in a longitudinal direction.

The transfer gate electrodes TG1 and TG2 are respectively formed between the photodiodes PD1 and PD2 and the first floating diffusion portion FD1 so as to form the first transfer transistor Tr11 and the second transfer transistor Tr12. The transfer gate electrodes TG3 and TG4 are respectively formed between the photodiodes PD3 and PD4 and the second floating diffusion portion FD2 so as to form the third transfer transistor Tr13 and the fourth transfer transistor Tr14.

In the present embodiment, in the shared pixels 22, the reset transistor Tr2 and the amplification transistor Tr3 are arranged to be divided vertically. At this time, the mutual amplification transistors Tr3 are arranged between the shared pixels neighboring in the row direction, that is, the shared pixels 102 of the neighboring columns, so as to be vertically crossed and the mutual reset transistors Tr2 are arranged so as to be vertically crossed (see arrow). That is, the reset transistor Tr2 and the amplification transistor Tr3 are lined up on the upper side of the first set having the two photodiodes PD1 and PD2 of one column and the upper side of the first set having the two photodiodes PD1 and PD2 of the other column. The amplification transistor Tr3 and the reset transistor Tr2 are lined up on the upper side of the second set having the two photodiodes PD3 and PD4 of one column and the other column such that the arrays of the reset transistor Tr2 and the amplification transistor Tr3 are vertically crossed. The reset transistor Tr2 and the amplification transistor Tr3 arranged vertically are arranged substantially at the same positions without being deviated in the row direction.

The reset transistor Tr2 has a source region 24, a drain region 25 and a reset gate electrode 26. The amplification transistor Tr3 has a source region 27, a drain region 28 and an amplification gate electrode 29.

In the shared pixels 22 of one of the neighboring columns, the source region 24 of the reset transistor, the amplification gate electrode 29 of the amplification transistor, and the first and second floating diffusion portions FD1 and FD2 are electrically connected by an FD wiring 31A. In the shared pixels 22 of the other of the neighboring columns, the source region 24 of the reset transistor, the amplification gate electrode 29 of the amplification transistor and the first and second floating diffusion portions FD1 and FD2 are electrically connected by an FD wiring 31B. In the present embodiment, the zigzag 4-pixel shared pixels 22 of the 3-transistor type are configured by the four photodiodes PD1 to PD4 of the zigzag array denoted by a broken line 32 and the pixel transistors Tr11 to Tr14, Tr2 and Tr3.

According to the solid-state imaging device 21 according to the first embodiment, the divisionally arranged reset transistor Tr2 and amplification transistors Tr3 are arranged so as to be vertically crossed between the shared pixels 22 of the neighboring columns. By this configuration, symmetry of every shared pixel including the FD wiring 31 of the shared pixel 22 is improved, a difference in wiring length of the FD wiring 31A and 31B disappears, and the wiring capacitance of the FD wirings 31A and 31B becomes constant in every shared pixel. Accordingly, a difference in photoelectric conversion efficiency of each column hardly occurs and a difference in sensitivity between columns disappears. As a result, a vertical stripe disappears.

In the case of using the color filter of the Bayer array, between the shared pixels of the neighboring columns, by arranging the reset transistor Tr2 and the amplification transistor Tr3 to be vertically crossed, the respective reset gate electrodes 26 are included in the Gr pixel and the Gb pixel. Since the reset gate electrodes 26 formed of polysilicon and having the same area are included in the Gr pixel and the Gb pixel, a difference in light absorption does not occur due to the reset gate electrodes. As a result, the vertical stripe does not occur. Accordingly, it is possible to provide a solid-state imaging device with a plurality of shared pixels, in which a difference in sensitivity between the shared pixels hardly occurs.

4. Second Embodiment

Configuration Example of Solid-State Imaging Device

Figure 4A:
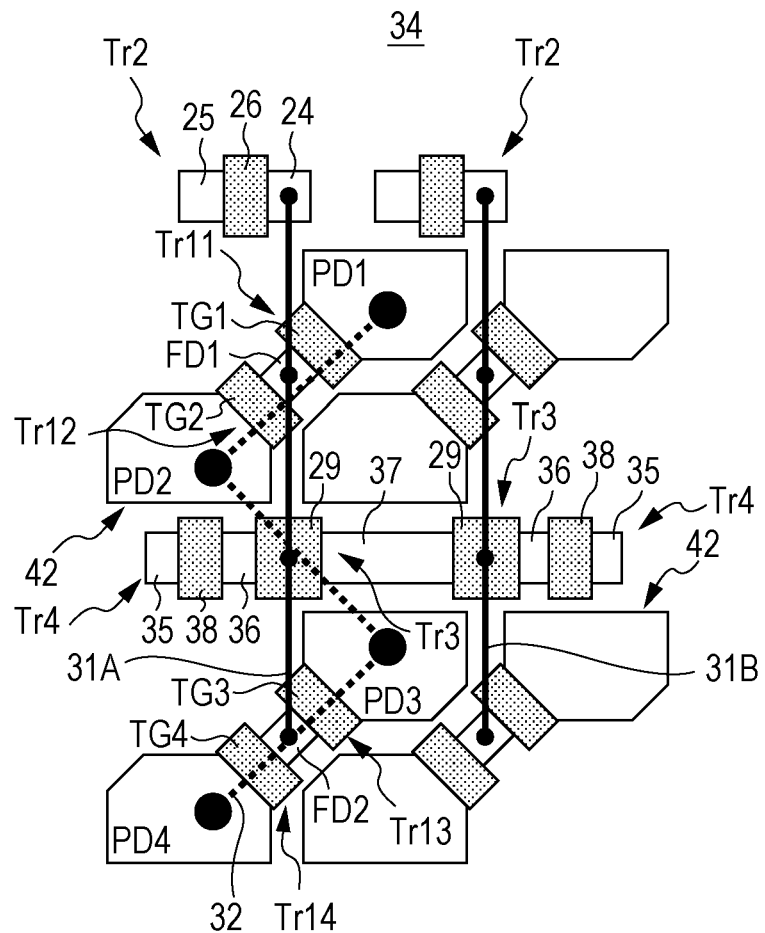
FIGS. 4A & 4B is a configuration diagram of the main parts of a solid-state imaging device according to a second embodiment of the present invention.

FIG. 4 shows a solid-state imaging device, that is, a CMOS solid-state imaging device according to a second embodiment of the present invention. FIG. 4 shows the schematic configuration of main portions applied to the CMOS solid-state imaging device in which pixel transistors of the 4-transistor type are provided and a plurality of shared pixels having a zigzag 4-pixel shared structure is arranged. The arrangement of the pixel transistors and the like of the present embodiment will be described in comparison with Comparative Example 2 of FIG. 5.

Figure 23:
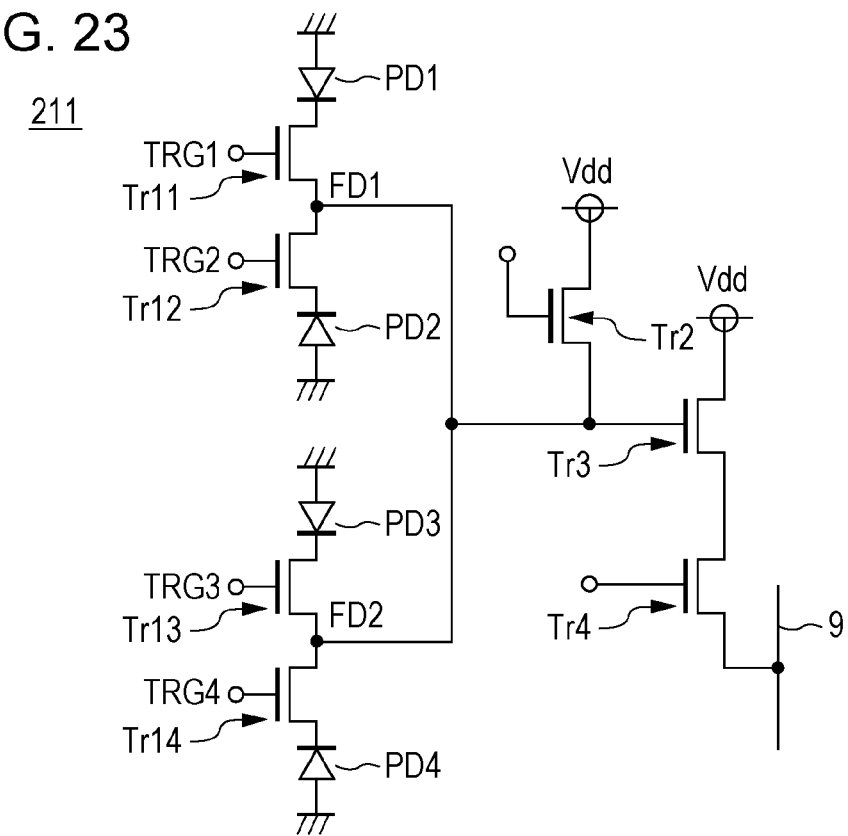
FIG. 23 is an equivalent circuit diagram of a 4-pixel shared structure of a 4-transistor type.

FIG. 23 shows an equivalent circuit of the shared pixels having the 4-pixel shared structure of the 4-transistor type. The shared pixels according to the present example include four photodiodes PD [PD1 to PD4] which are the photoelectric conversion portions, four transfer transistors Tr1 [Tr11 to Tr14], one reset transistor Tr2, one amplification transistor Tr3, and one selection transistor Tr4. A drain of the selection transistor Tr4 is connected to a source of the amplification transistor Tr3 and a source thereof is connected to a vertical signal line 9. Since the other configuration has the same connection circuit as that described in FIG. 22, the portions corresponding to FIG. 22 are denoted by the same reference numerals and the description thereof will be omitted.

First, a solid-state imaging device according to Comparative Example 2 of FIG. 5 will be described. The solid-state imaging device 114 of Comparative Example 2 is a CMOS solid-state imaging device having a zigzag 4-pixel shared structure. The solid-state imaging device 114 of Comparative Example 2 is the same as Comparative Example 1 except that the pixel transistors of the 4-transistor type including the transfer transistor Tr1 [Tr11 to Tr14], the reset transistor Tr2, the amplification transistor Tr3 and the selection transistor Tr4 are used. In the solid-state imaging device 114 of the present comparative example, the reset transistor Tr2 is arranged on the upper side of the first set having the two photodiodes PD1 and PD2 and a serial circuit of the amplification transistor Tr3 and the selection transistor Tr4 is arranged on the upper side of the second set having the two photodiodes PD3 and PD4. This serial circuit includes diffusion regions 115, 116 and 117 which become the source/drain regions, the amplification gate electrode 109, and the selection gate electrode 118. That is, the amplification transistor Tr3 is formed by the diffusion regions 116 and 117 as the source region and the drain region and the amplification gate electrode 109. The selection transistor Tr4 is formed by the diffusion regions 115 and 116 as the source region and the drain region and the selection gate electrode 118. In the shared pixels 122 of the neighboring columns, the reset transistors Tr2 are lined up in the same direction and are arranged in the same row direction and the serial circuits of the amplification transistors Tr3 and the selection transistors Tr4 are lined up in the same direction and are arranged in the same row direction.

Figure 3:
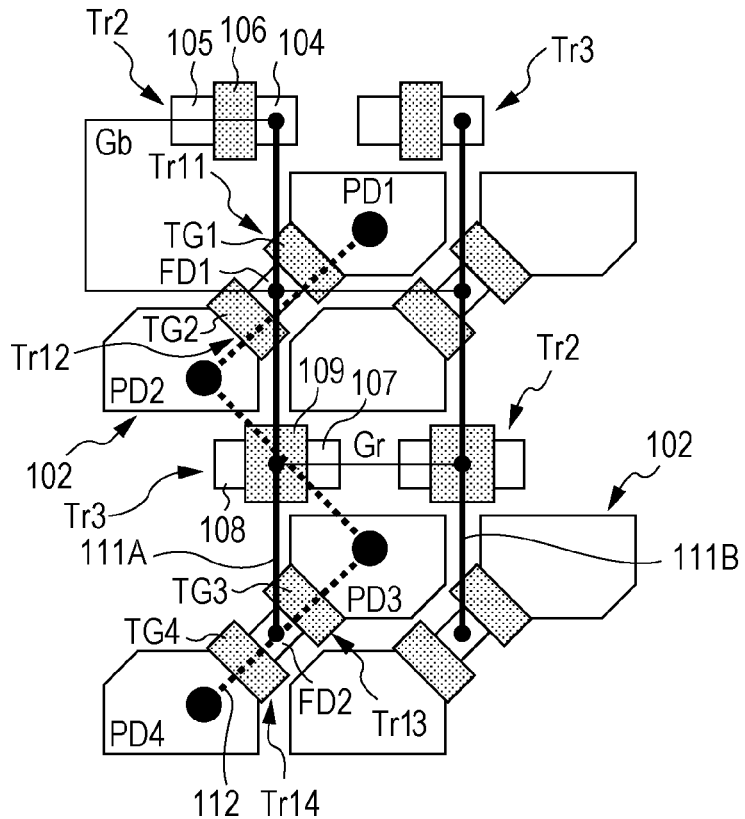
FIG. 3 is a configuration diagram of the main parts of a solid-state imaging device according to Comparative Example 1.

Since the other configuration is the same as that described in FIG. 3, the portions corresponding to FIG. 3 are denoted by the same reference numerals and the description thereof will be omitted.

Figure 5:
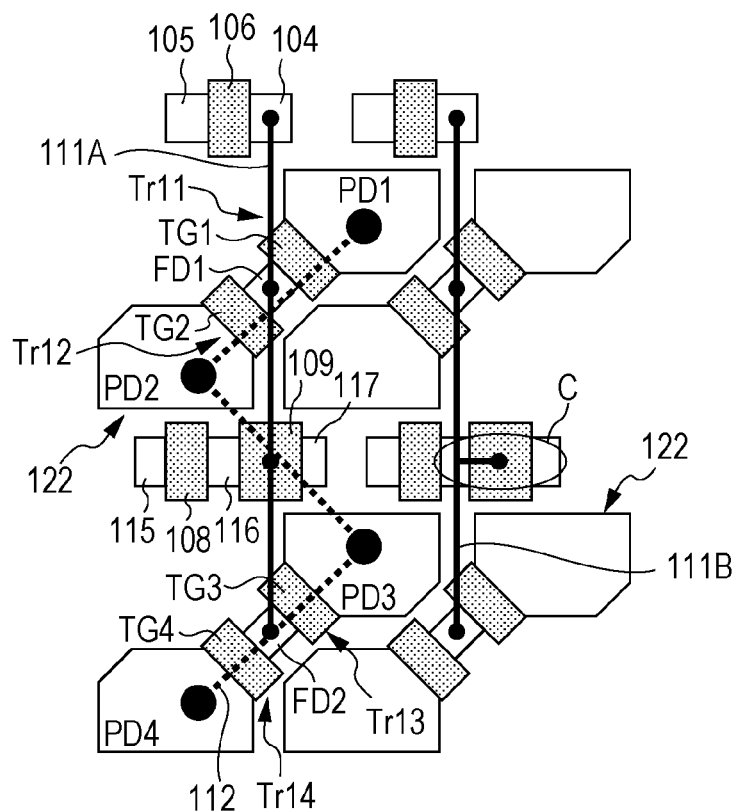
FIG. 5 is a configuration diagram of the main parts of a solid-state imaging device according to Comparative Example 2.

In the solid-state imaging device 114 according to Comparative Example 2, the wiring lengths of the FD wiring 111A of the shared pixel 122 of the left column and the FD wiring 111B of the shared pixel 122 of the right column are different in FIG. 5. That is, the FD wiring 111B of the right column is greater than the FD wiring 111A of the left column by the length denoted by an elliptic frame C. Accordingly, a difference in wiring capacitance between the FD wiring 111A and the FD wiring 111B occurs and thus conversion efficiency is different between the shared pixels of the neighboring columns. As a result, a difference in conversion efficiency between columns occurs and thus a vertical stripe occurs.

Next, the solid-state imaging device according to the second embodiment will be described. The solid-state imaging device 34 of the second embodiment is a CMOS solid-state imaging device having the zigzag 4-pixel shared structure. The solid state imaging device 34 of the second embodiment includes the pixel transistors of the 4-transistor type including the transfer transistors Tr1 [TR11 to Tr14], the reset transistor Tr2, the amplification transistor Tr3 and the selection transistor Tr4.

Figure 4B:
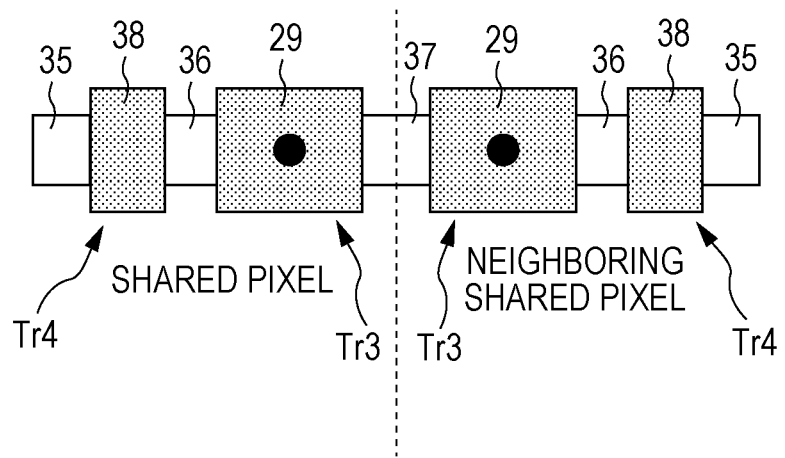

In the solid-state imaging device 34 according to the second embodiment, as shown in FIG. 4, in each of the shared pixels of the neighboring columns, the reset transistor Tr2 is arranged on the upper side of the first set having the two photodiodes PD1 and PD2. In the shared pixels of the neighboring columns, the serial circuits of the amplification transistor Tr3 and the selection transistor Tr4 are integrally arranged on the upper side of the second set having the two photodiodes PD3 and PD4 so as to be horizontally reversed between the neighboring columns. That is, as shown in FIG. 4B, the drain regions of the amplification transistors Tr3 of the second serial circuits are formed of the common diffusion region 37 and the serial circuits are arranged so as to be horizontally reversed between the shared pixels of the neighboring columns. The serial circuit includes the amplification transistor Tr3 including the diffusion regions 36 and 37 as the source region and the drain region and the amplification gate electrode 29 and the selection transistor Tr4 including the diffusion regions 35 and 36 as the source region and the drain region and the selection gate electrode 38.

Since the other configuration has the same connection circuit as that described in the first embodiment, the portions corresponding to FIG. 2 are denoted by the same reference numerals and the description thereof will be omitted.

According to the solid-state imaging device 34 of the second embodiment, between the shared pixels 42 of the neighboring columns, the wiring lengths of the FD wiring 31A and the FD wiring 31B become equal. Accordingly, a difference in wiring capacitance between the FD wiring 31A and the FD wiring 31B does not occur and a difference in conversion efficiency between columns does not occur. As a result, a difference in sensitivity between columns does not occur and a vertical stripe does not occur. Accordingly, it is possible to provide a solid-state imaging device with a plurality of shared pixels, in which a difference in sensitivity between the shared pixels hardly occurs.

5. Third Embodiment

Configuration Example of Solid-State Imaging Device

Figure 6:
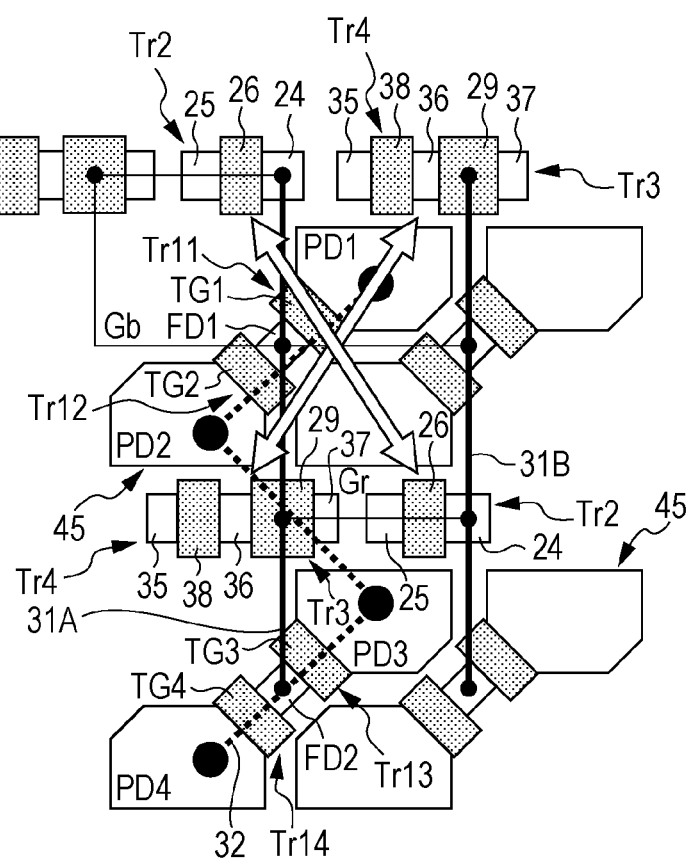
FIG. 6 is a configuration diagram of the main parts of a solid-state imaging device according to a third embodiment of the present invention.

FIG. 6 shows a solid-state imaging device, that is, a CMOS solid-state imaging device according to a third embodiment of the present invention. FIG. 6 shows the schematic configuration of main portions applied to the CMOS solid-state imaging device in which pixel transistors of the 4-transistor type are provided and a plurality of shared pixels having a zigzag 4-pixel shared structure is arranged. The arrangement of the pixel transistors and the like of the present embodiment will be described in comparison with a Comparative Example 3 of FIG. 7.

Figure 7:
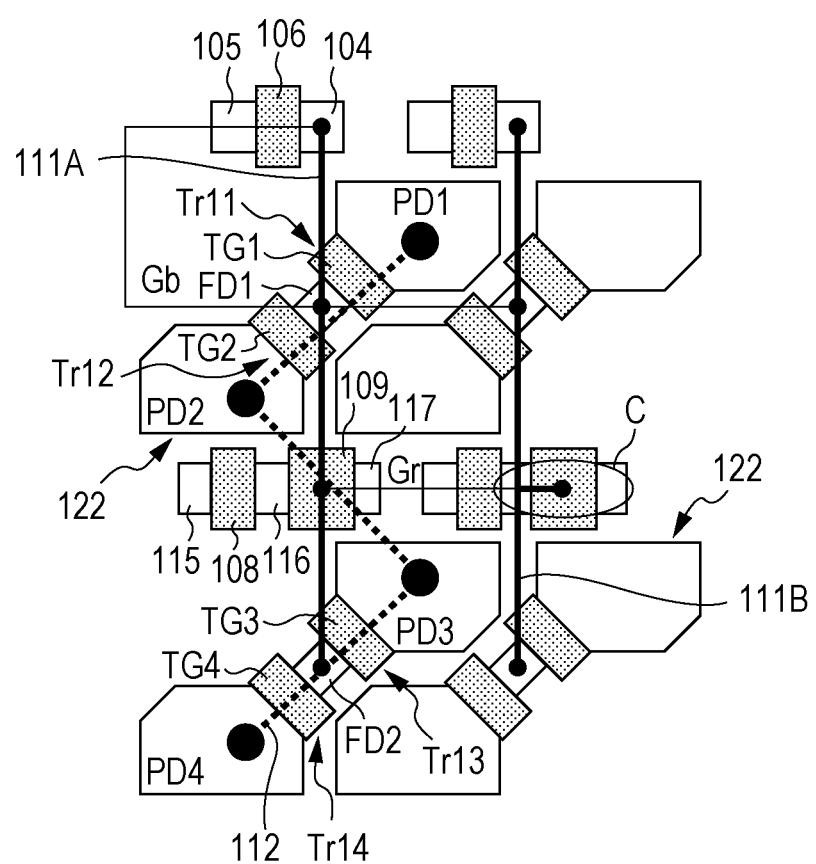
FIG. 7 is a configuration diagram of the main parts of a solid-state imaging device according to Comparative Example 3.

First, the solid-state imaging device according to Comparative Example 3 of FIG. 7 will be described. The solid-state imaging device 124 of Comparative Example 3 is a CMOS solid-state imaging device having a zigzag 4-pixel shared structure using color filters of the Bayer array. Since the other configuration is the same as that of the above-described Comparative Example 2 except that the Gr pixel and Gb pixel are included, the portions corresponding to FIG. 5 are denoted by the same reference numerals and the description thereof will be omitted.

In the solid-state imaging device 124 of Comparative Example 3, similar to that described in FIG. 5, the wiring lengths of the FD wiring 111A of the shared pixel 122 of the left column and the FD wiring 111B of the shared pixel 122 of the right column are different. That is, the FD wiring 111B of the right column is greater than the FD wiring 111A of the left column by the length denoted by an elliptic frame C. Accordingly, a difference in wiring capacitance between the FD wiring 111A and the FD wiring 111B occurs and thus conversion efficiency is different between the shared pixels of the neighboring columns. As a result, a difference in conversion efficiency between columns occurs and thus a vertical stripe occurs.

In addition, the Gb pixel has a reset gate electrode 106 formed of polysilicon of the reset transistor Tr2 in the shared pixels 122. The Gr pixel has an amplification gate electrode 109 formed of polysilicon of the amplification transistor Tr3 in the shared pixels 122. The gate length of the amplification gate electrode 109 is greater than that of the reset gate electrode 106. The Gr pixel and the Gb pixel are the same green pixel, but include gate electrodes having different areas. Thus, a difference in light absorption between the Gr pixel and the Gb pixel occurs due to the gate electrodes. As a result, a deviation in sensitivity between columns occurs and thus a vertical stripe occurs.

Next, the solid-state imaging device according to the third embodiment will be described. The solid-state imaging device 44 according to the third embodiment is a CMOS solid-state imaging device having a zigzag 4-pixel shared structure. The solid-state imaging device 44 of the third embodiment is the same as that of the second embodiment except that the arrangement of the pixel transistors is changed.

In the solid-state imaging device 44 according to the third embodiment, the serial circuits of the amplification transistor Tr3 and the selection transistor Tr4 are arranged between the shared pixels 45 of the neighboring columns so as to be vertically crossed without being horizontally reversed and, similarly, the reset transistors Tr2 are arranged so as to be vertically crossed (see arrow). That is, the reset transistor Tr2 and the serial circuit are lined up on the upper side of the first set having the two photodiodes PD1 and PD2 of one column and the upper side of the first set having the two photodiodes PD1 and PD2 of the other column. The serial circuit and the reset transistor Tr2 are lined up on the upper side of the second set having the two photodiodes PD3 and PD4 of one column and the other column such that the arrays of the reset transistor Tr2 and the serial circuit are vertically crossed.

Since the other configuration is the same as that of the second embodiment, the portions corresponding to FIG. 4 are denoted by the same reference numerals and the description thereof will be omitted.

According to the solid-state imaging device 44 according to the third embodiment, the reset transistors Tr2 and the serial circuits of the amplification transistor Tr3 and the selection transistor Tr4 are arranged so as to be vertically crossed between the shared pixels 45 of the neighboring columns. By this configuration, the wiring lengths of the FD wiring 31A and the FD wiring 31B between the shared pixels 45 of the neighboring columns become equal, a difference in wiring capacitance between the FD wiring 31A and the FD wiring 31B does not occur, and a difference in conversion efficiency between columns does not occur. As a result, a difference in sensitivity between columns disappears and a vertical stripe does not occur.

In the case of using the color filters of the Bayer array, portions of the reset gate electrode 26 and the amplification gate electrode 29 are respectively included in the Gr pixel and the Gb pixel according to the above-described configuration. Since the portions of the reset gate electrode 26 and the amplification gate electrode 29 formed of polysilicon and having the same area are included in the Gr pixel and the Gb pixel, a difference in light absorption does not occur due to the reset gate electrodes. As a result, a vertical stripe does not occur. Accordingly, it is possible to provide a solid-state imaging device having a 4-pixel shared structure, in which a difference in sensitivity between the shared pixels hardly occurs.

6. Fourth Embodiment

Configuration Example of Solid-State Imaging Device

Figure 8A:
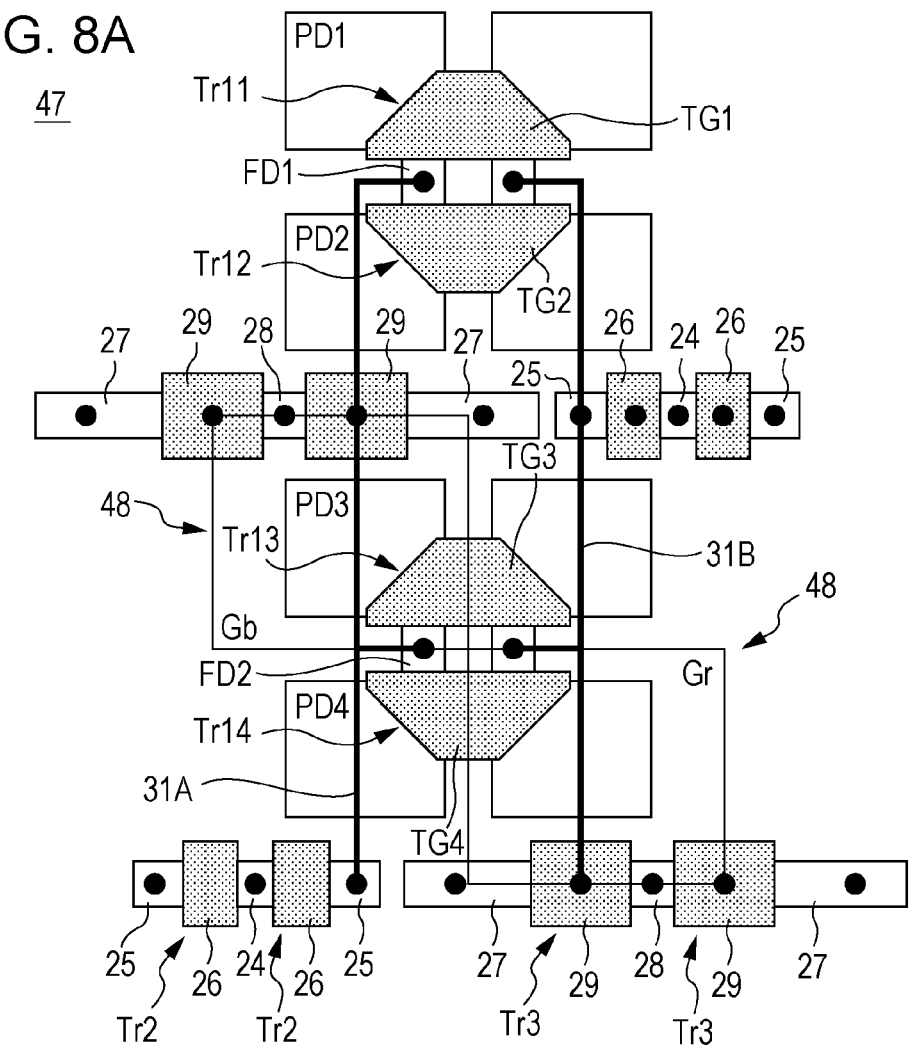
FIGS. 8A & 8B is a configuration diagram of the main parts of a solid-state imaging device according to a fourth embodiment of the present invention.
Figure 8B:
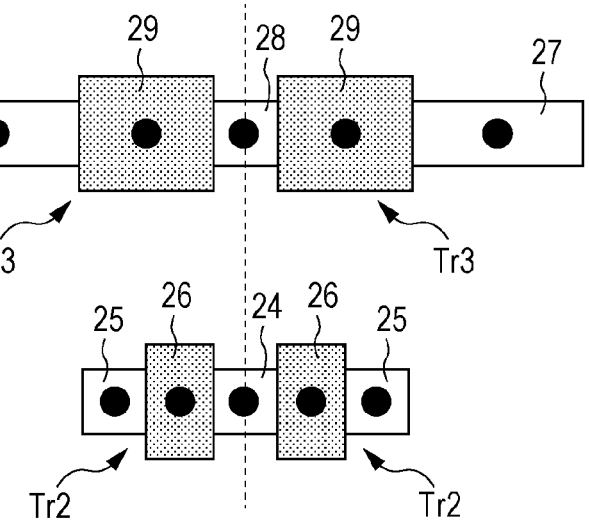

FIG. 8 shows a solid-state imaging device, that is, a CMOS solid-state imaging device according to a fourth embodiment of the present invention. FIG. 8 shows the schematic configuration of main portions applied to the CMOS solid-state imaging device in which pixel transistors of the 3-transistor type are provided and a plurality of shared pixels having a longitudinal 4-pixel shared structure is arranged. The arrangement of the pixel transistors and the like of the present embodiment will be described in comparison with Comparative Examples 4-1 and 4-2 of FIGS. 9 and 10.

Figure 9:
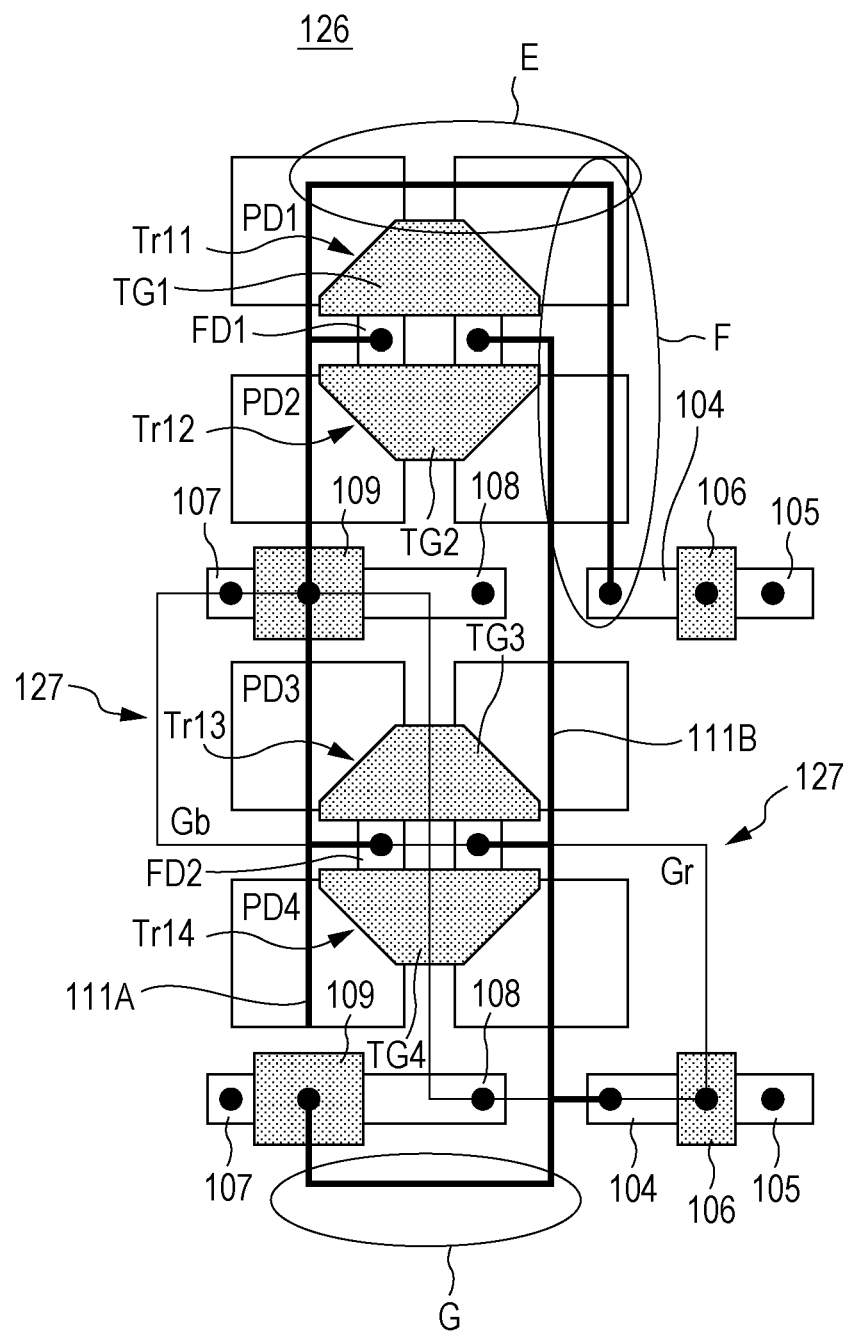
FIG. 9 is a configuration diagram of the main parts of a solid-state imaging device according to Comparative Example 4-1.

First, Comparative Example 4-1 of FIG. 9 will be described. The solid-state imaging device 126 of Comparative Example 4-1 includes shared pixels having a longitudinal 4-pixel shared structure and including four photodiodes PD [PD1 to PD4] arranged in the vertical (longitudinal) direction. That is, a first set sharing a first floating diffusion portion FD1 between two longitudinally neighboring photodiodes PD1 and PD2 and a second set sharing a second floating diffusion portion FD2 between two longitudinally neighboring photodiodes PD3 and PD4 are included. The first set and the second set are adjacently arranged in the vertical direction.

The transfer gate electrodes TG1 and TG2 are respectively formed between the photodiodes PD1 and PD2 and the first floating diffusion portion FD1 so as to form the first transfer transistor Tr11 and the second transfer transistor Tr12. The transfer gate electrodes TG3 and TG4 are respectively formed between the photodiodes PD3 and PD4 and the second floating diffusion portion FD2 so as to form the third transfer transistor Tr13 and the fourth transfer transistor Tr14. The transfer gate electrodes TG1 to TG4 are formed commonly with the transfer gate electrodes TG1 to TG4 of the shared pixels of the neighboring column.

The amplification transistor Tr3 and the reset transistor Tr2 are lined up and arranged in the row direction on the lower side of the first set over the shared pixels 127 of the neighboring column and, similarly, the amplification transistor Tr3 and the reset transistor Tr2 are lined up and arranged in the row direction on the lower side of the second set. As shown, the FD wirings 111A and 111B are formed. Since the other configuration is the same as that of the above-described comparative example, the portions corresponding thereto are denoted by the same reference numerals and the description thereof will be omitted.

Figure 10:
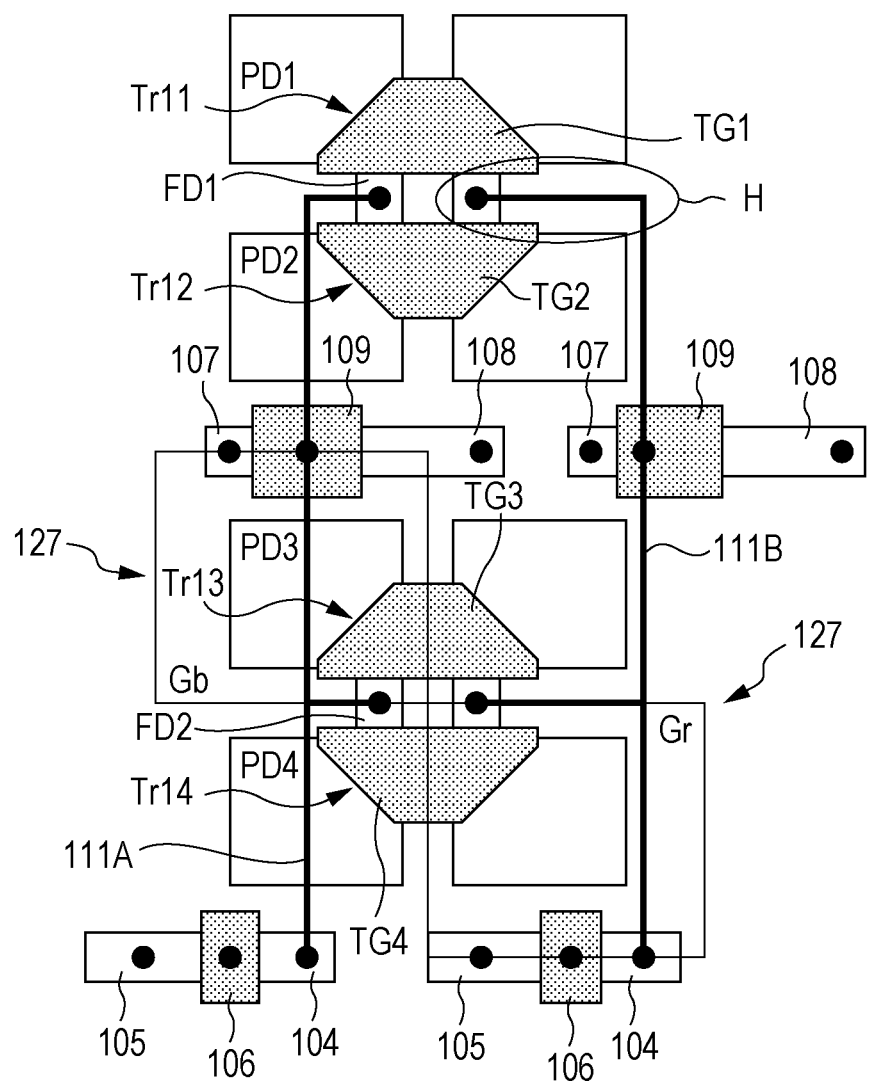
FIG. 10 is a configuration diagram of the main parts of a solid-state imaging device according to Comparative Example 4-2.

In the solid-state imaging device 128 of Comparative Example 4-2 of FIG. 10, the reset transistors Tr2 corresponding to the shared pixels of the columns are lined up and arranged in the row direction on the lower side of the first set over the shared pixels 127 of the neighboring columns. In addition, the amplification transistors Tr3 corresponding to the shared pixels of the columns are lined up and arranged in the row direction on the lower side of the second set over the shared pixels 127 of the neighboring columns. As shown, the FD wirings 111A and 111B are formed. Since the other configuration is the same as that of FIG. 9, the portions corresponding thereto are denoted by the same reference numerals and the description thereof will be omitted.

In the solid-state imaging device 126 according to Comparative Example 4-1 and the solid-state imaging device 128 of Comparative Example 4-2, the wiring lengths of the FD wiring 111A of the left shared pixel and the FD wiring 111B of the right shared pixel are different. The wiring lengths are different due to the presence of the wiring portions denoted by elliptic frames E to G or an elliptic frame H. Accordingly, a difference in wiring capacitance occurs, a difference in conversion efficiency between columns occurs, and a vertical stripe occurs. In the case of using the color filters of the Bayer array, since the areas of the gate electrodes included in the Gr pixel and the Gb pixel are different, a difference in light absorption of the gate electrodes of the Gr pixel and the Gb pixel occurs. As a result, a deviation in sensitivity between columns occurs and thus a vertical stripe occurs.

Next, the solid-state imaging device according to the fourth embodiment will be described. The solid-state imaging device 47 of the fourth embodiment includes shared pixels having a longitudinal 4-pixel shared structure and including four photodiodes PD [PD1 to PD4] arranged in the vertical (longitudinal) direction, as shown in FIG. 8. That is, a first set sharing a first floating diffusion portion FD1 between two longitudinally neighboring photodiodes PD1 and PD2 and a second set sharing a second floating diffusion portion FD2 between two longitudinally neighboring photodiodes PD3 and PD4 are included. The first set and the second set are adjacently arranged in the vertical direction.

The transfer gate electrodes TG1 and TG2 are respectively formed between the photodiodes PD1 and PD2 and the first floating diffusion portion FD1 so as to form the first transfer transistor Tr11 and the second transfer transistor Tr12. The transfer gate electrodes TG3 and TG4 are respectively formed between the photodiodes PD3 and PD4 and the second floating diffusion portion FD2 so as to form the third transfer transistor Tr13 and the fourth transfer transistor Tr14. The transfer gate electrodes TG1 to TG4 are formed commonly with the transfer gate electrodes TG1 to TG4 of the shared pixels of the neighboring column.

In the present embodiment, the amplification transistors Tr3 of the shared pixels of the neighboring columns are horizontally reversed and the respective drain regions 28 are commonly integrated. The reset transistors Tr2 of the shared pixels of the neighboring columns are horizontally reversed and the respective drain regions 25 are commonly integrated. The horizontally reversed and integrated amplification transistors Tr3 and the horizontally reversed and integrated reset transistors Tr2 are arranged in the row direction. Simultaneously, the array of the integrated amplification transistors Tr3 and the integrated reset transistors Tr2 is arranged so as to be vertically crossed between the lower side of the first set and the lower side of the second set.

In the left shared pixel 48, the first floating diffusion portion FD1 and the amplification gate electrode 29 of the upper stage and the second floating diffusion portion FD2 and the source region 24 of the reset transistor Tr2 of the lower stage are electrically connected by an FD wiring 31A. In the right shared pixel 48, the first floating diffusion portion FD1 and the source region 24 of the reset transistor Tr2 of the upper stage and the second floating diffusion portion FD2 and the amplification gate electrode 29 of the lower stage are electrically connected by an FD wiring 31B. Since the other configuration is the same as that of the above-described embodiment, the portions corresponding thereto are denoted by the same reference numerals and the description thereof will be omitted.

According to the solid-state imaging device 47 according to the fourth embodiment, by arranging the pixel transistors as described above, the wiring length of the FD wiring 31A of the shared pixel 48 of the left column and the FD wiring 31B of the shared pixel 48 of the right column become equal. Accordingly, a difference in wiring capacitance between the FD wirings 31A and 31B does not occur and a difference in conversion efficiency between columns does not occur. As a result, a vertical stripe does not occur.

In the case of using the color filters of the Bayer array, by arranging the pixel transistors as described above, the gate electrodes having the same area are included in the Gr pixel and the Gb pixel. Accordingly, a difference in light absorption of the gate electrodes formed of polysilicon between the Gr pixel and the Gb pixel does not occur and a vertical stripe does not occur. Accordingly, it is possible to provide a solid-state imaging device having a longitudinal 4-pixel shared structure, in which a difference in sensitivity between the shared pixels hardly occurs.

7. Fifth Embodiment

Configuration Example of Solid-State Imaging Device

Figure 11A:
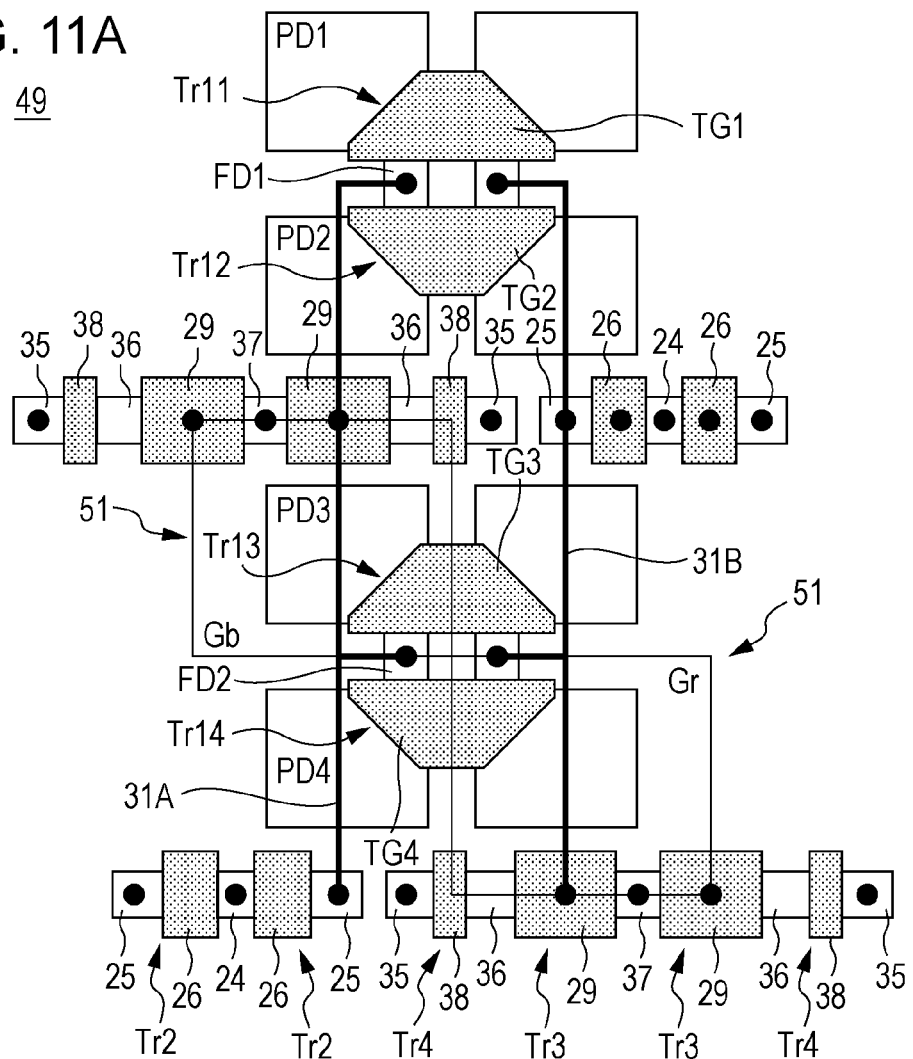
FIGS. 11A & 11B is a configuration diagram of the main parts of a solid-state imaging device according to a fifth embodiment of the present invention.
Figure 11B:
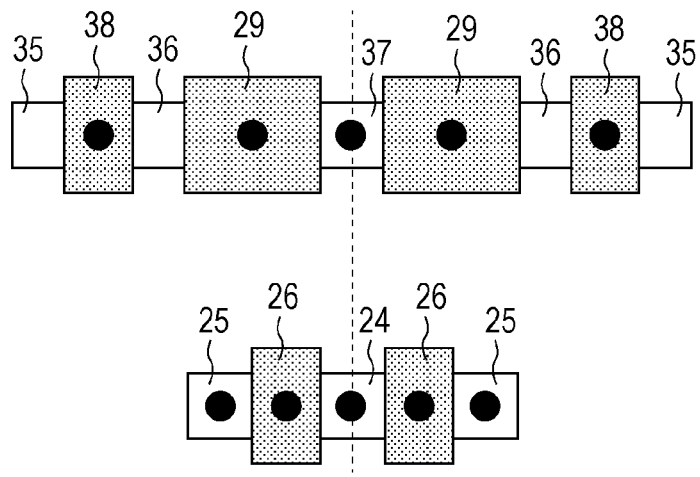

FIG. 11 shows a solid-state imaging device, that is, a CMOS solid-state imaging device according to a fifth embodiment of the present invention. FIG. 11 shows the schematic configuration of main portions applied to the CMOS solid-state imaging device in which pixel transistors of the 4-transistor type are provided and a plurality of shared pixels having a longitudinal 4-pixel shared structure is arranged. The arrangement of the pixel transistors and the like of the present embodiment will be described in comparison with Comparative Examples 5-1 and 5-2 of FIGS. 12 and 13.

Figure 12:
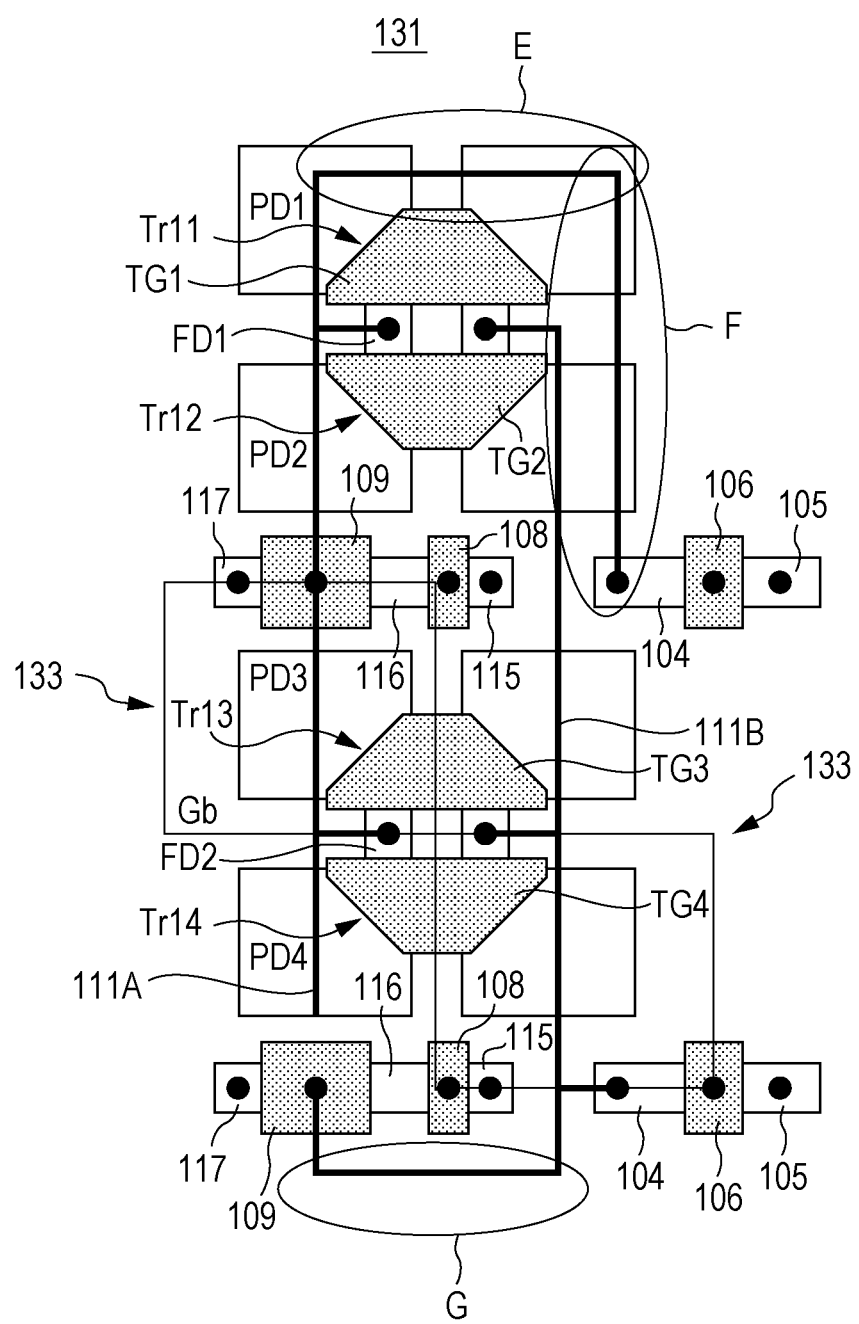
FIG. 12 is a configuration diagram of the main parts of a solid-state imaging device according to Comparative Example 5-1.

First, the solid-state imaging device according to Comparative Example 5-1 of FIG. 12 will be described. In the solid-state imaging device 131 of Comparative Example 5-1, instead of the above-described array of the reset transistor and the amplification transistor of FIG. 9, the serial circuit of the amplification transistor Tr3 and the selection transistor Tr4 and the reset transistor Tr2 are arranged. The configuration of the serial circuit is the same as that described in FIG. 5. A reference numeral 133 denotes the shared pixel. Since the other configuration is the same as that of FIG. 9, the portions corresponding thereto are denoted by the same reference numerals and the description thereof will be omitted.

Figure 13:
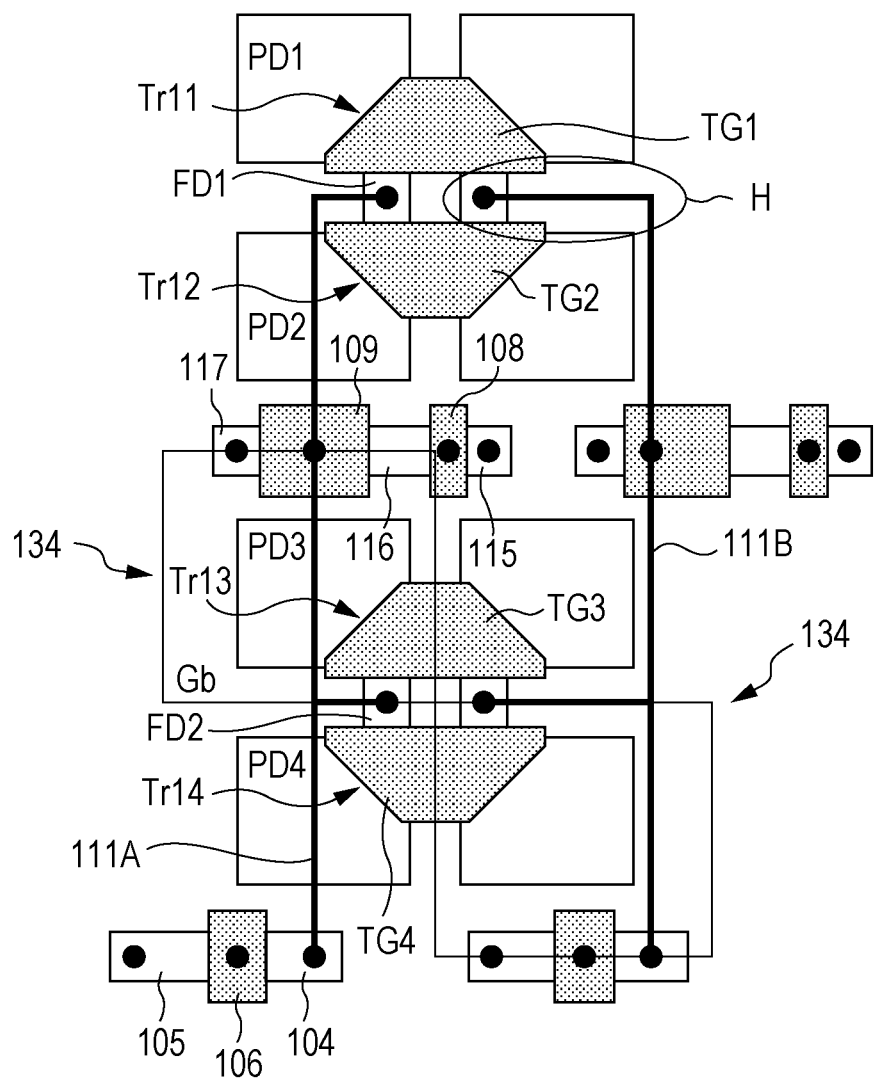
FIG. 13 is a configuration diagram of the main parts of a solid-state imaging device according to Comparative Example 5-2.

In the solid-state imaging device 132 of Comparative Example 5-2 of FIG. 13, instead of the array of the reset transistors and the amplification transistors of FIG. 10, the reset transistors Tr2 and the serial circuits of the amplification transistor Tr3 and the selection transistor Tr4 are arranged. The configuration of the serial circuit is the same as that described in FIG. 5. A reference numeral 134 denotes the shared pixel. Since the other configuration is the same as that of FIG. 10, the portions corresponding thereto are denoted by the same reference numerals and the description thereof will be omitted.

In the solid-state imaging device 131 according to Comparative Example 5-1 and the solid-state imaging device 132 of Comparative Example 5-2, the wiring lengths of the FD wiring 111A of the left shared pixel and the FD wiring 111B of the right shared pixel are different. The wiring lengths are different due to the presence of the wiring portions denoted by elliptic frames E to G or an elliptic frame H. Accordingly, a difference in wiring capacitance occurs, a difference in conversion efficiency between columns occurs, and a vertical stripe occurs. In the case of using the color filters of the Bayer array, since the areas of the gate electrodes included in the Gr pixel and the Gb pixel are different, a difference in light absorption of the gate electrodes of the Gr pixel and the Gb pixel occurs. As a result, a deviation in sensitivity between columns occurs and thus a vertical stripe occurs.

Next, the solid-state imaging device according to the fifth embodiment will be described. In the solid-state imaging device 49 of the fifth embodiment, as shown in FIG. 11, the serial circuit of the amplification transistor Tr3 and the selection transistor Tr4 and the reset transistor Tr2 are horizontally reversed in the shared pixels of the neighboring columns. The horizontally reversed serial circuit and reset transistor Tr2 are arranged so as to be vertically crossed. That is, two reset transistors Tr2 in which the drain region 25 is commonly integrated and two serial circuits in which the drain region of the amplification transistor Tr3 is commonly integrated are arranged in the row direction on the lower side of the first set having two photodiodes PD1 and PD2. The integrated reset transistor Tr2 and the serial circuit are arranged on the lower side of the second set having two photodiodes PD3 and PD4 so as to become the array crossing the array of the integrated serial circuit and reset transistor Tr2. The configuration of the serial circuit is the same as that described in FIG. 4. A reference numeral 51 denotes the shared pixel.

Since the other configuration is the same as that of FIG. 8, the portions corresponding to FIG. 8 are denoted by the same reference numerals and the description thereof will be omitted.

According to the solid-state imaging device 49 according to the fifth embodiment, by arranging the pixel transistors as described above, the wiring length of the FD wiring 31A of the shared pixel 51 of the left column and the FD wiring 31B of the shared pixel 51 of the right column become equal. Accordingly, a difference in wiring capacitance between the FD wirings 31A and 31B does not occur and a difference in conversion efficiency between columns does not occur. As a result, a vertical stripe does not occur.

In the case of using the color filters of the Bayer array, by arranging the pixel transistors as described above, the gate electrodes having the same area are included in the Gr pixel and the Gb pixel. Accordingly, a difference in light absorption of the gate electrodes formed of polysilicon between the Gr pixel and the Gb pixel does not occur and a vertical stripe does not occur. Accordingly, it is possible to provide a solid-state imaging device having a longitudinal 4-pixel shared structure, in which a difference in sensitivity between the shared pixels hardly occurs.

8. Sixth Embodiment

Configuration Example of Solid-State Imaging Device

Figure 14:
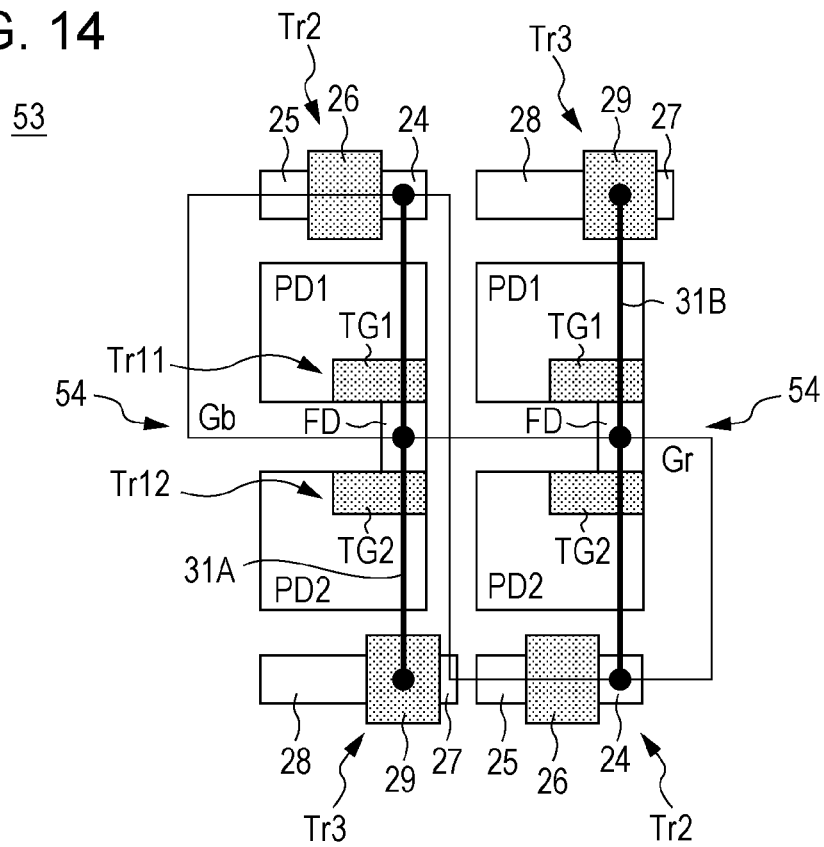
FIG. 14 is a configuration diagram of the main parts of a solid-state imaging device according to a sixth embodiment of the present invention.

FIG. 14 shows a solid-state imaging device, that is, a CMOS solid-state imaging device according to a sixth embodiment of the present invention. FIG. 14 shows the schematic configuration of the main parts applied to the CMOS solid-state imaging device in which pixel transistors of the 3-transistor type are provided and a plurality of shared pixels having a longitudinal 2-pixel shared structure is arranged. The arrangement of the pixel transistors and the like of the present embodiment will be described in comparison with Comparative Example 6 of FIG. 15.

Figure 24:
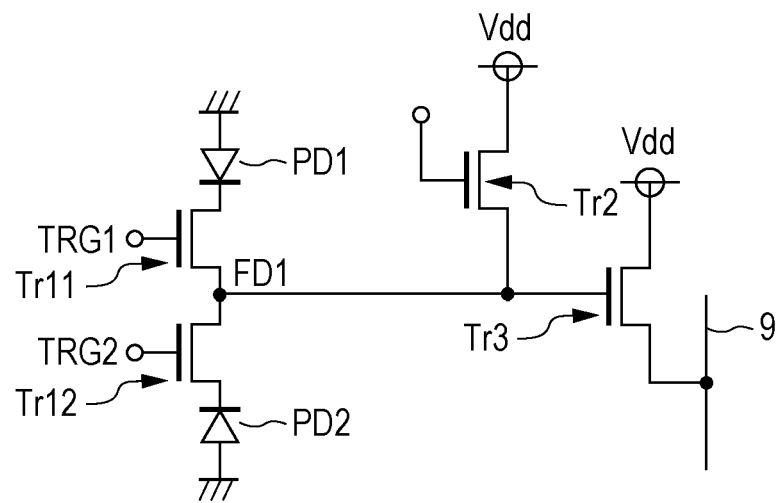
FIG. 24 is an equivalent circuit diagram of a 2-pixel shared structure of a 3-transistor type.

FIG. 24 shows an equivalent circuit of the shared pixels having pixel transistors of the 3-transistor type and the 2-pixel shared structure. The portions corresponding to FIG. 22 are denoted by the same reference numerals and the description thereof will be omitted.

Figure 15:
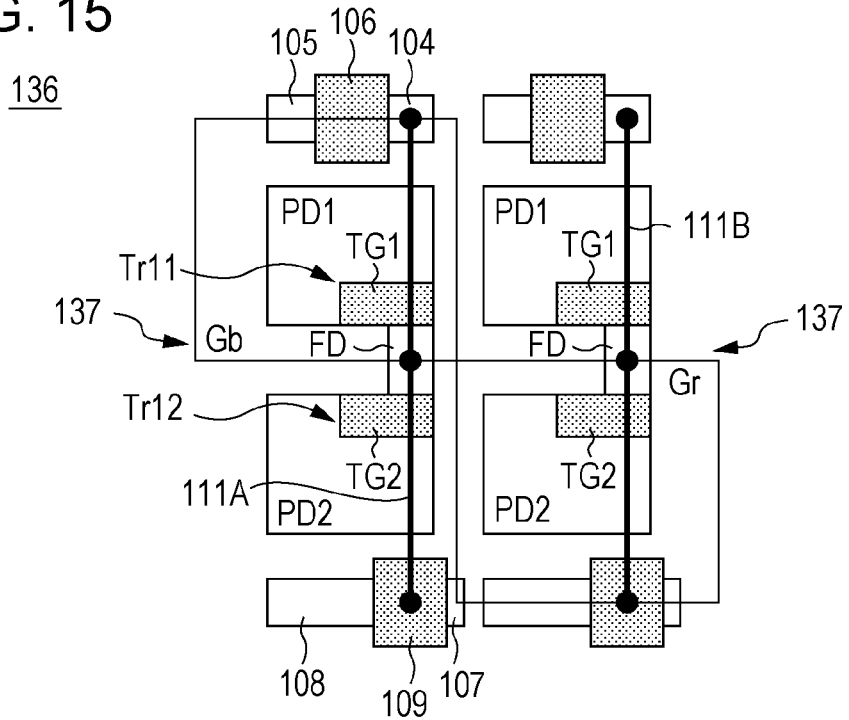
FIG. 15 is a configuration diagram of the main parts of a solid-state imaging device according to Comparative Example 6.

First, Comparative Example 6 of FIG. 15 will be described. The solid-state imaging device according to Comparative Example 6 is completed by two-dimensionally arranging a plurality of shared pixels 137 having a 2-pixel shared structure in which one floating diffusion portion FD is shared between vertically (longitudinally) neighboring two photodiodes PD1 and PD2. Transfer gate electrodes are formed between the two photodiodes PD1 and PD2 and the floating diffusion portion FD so as to form transfer transistors Tr11 and Tr12. A reset transistor Tr2 and an amplification transistor Tr3 are arranged so as to be vertically divided with the two photodiodes PD1 and PD2 interposed therebetween. The shared pixels 137 having the 2-pixel shared structure are formed of the two photodiodes PD1 and PD2, one floating diffusion portion FD, two transfer transistors Tr11 and Tr12, one reset transistor Tr2 and one amplification transistor Tr3.

The reset transistor Tr2 includes a source region 104, a drain region 105 and a reset gate electrode 106. The amplification transistor Tr3 includes a source region 107, a drain region 108 and an amplification gate electrode 109. In the shared pixels 137 of the neighboring columns, the reset transistors Tr2 are lined up in the same direction and arranged in the same row direction and the amplification transistors Tr3 are lined up in the same direction and arranged in the same row direction. In the shared pixels 137 of the columns, the FD wirings 111 [111A and 111B] are electrically connected to the source regions 104 of the reset transistors Tr2, the floating diffusion portion FD and the amplification gate electrodes 109.

In the solid-state imaging device 136 of Comparative Example 6, the wiring lengths of the FD wirings 111A and 111B of the neighboring columns become equal. For example, in the case of using the color filters of the Bayer array, a portion of the reset gate electrode 106 is included in the Gr pixel and a portion of the amplification gate electrode 109 is included in the Gb pixel. Since the Gr pixel and the Gb pixel include respective gate electrodes having different areas, a difference in light absorption of the gate electrodes between the Gr pixel and the Gb pixel occurs. As a result, a deviation in sensitivity between columns occurs and a vertical stripe occurs.

Next, the solid-state imaging device according to the sixth embodiment of the present invention will be described. As shown in FIG. 14, the solid-state imaging device 53 according to the sixth embodiment is completed by two-dimensionally arranging a plurality of shared pixels 54 having a 2-pixel shared structure in which one floating diffusion portion FD is shared between two vertically (longitudinally) neighboring photodiodes PD1 and PD2. Transfer gate electrodes TG1 and TG2 are formed between the two photodiodes PD1 and PD2 and the floating diffusion portion FD so as to form the transfer transistors Tr11 and Tr12.

In the present embodiment, the reset transistor Tr2 and the amplification transistor Tr3 are divisionally arranged on the upper and lower side of the shared pixels 54. In addition, the reset transistor Tr2 and the amplification transistor Tr3 are lined up and arranged in the row direction on the upper side of the shared pixels of the neighboring columns and the reset transistor Tr2 and the amplification transistor Tr3 are arranged on the lower side thereof such that the array thereof crosses the array of the upper side. The reset transistor Tr2 includes a source region 24, a drain region 25 and a reset gate electrode 26. The amplification transistor Tr3 includes a source region 27, a drain region 28 and an amplification gate electrode 29. In the shared pixels 54, the FD wirings 31 [31A and 31B] are electrically connected to the source regions 24 of the reset transistors Tr2, the floating diffusion portion FD and the amplification gate electrodes 29.

According to the solid-state imaging device 53 according to the sixth embodiment, in the 2-pixel shared configuration, the reset transistor Tr2 and the amplification transistor Tr3 are arranged so as to be vertically crossed between the shared pixels 54 of the neighboring columns. By this configuration, the wiring length of the FD wiring 31A of the shared pixel 54 of the left column and the FD wiring 31B of the shared pixel 54 of the right column become equal. Accordingly, a difference in wiring capacitance between the FD wirings 31A and 31B does not occur and a difference in conversion efficiency between columns does not occur. As a result, a vertical stripe does not occur.

In the case of using the color filters of the Bayer array, by arranging the pixel transistors as described above, the gate electrodes having the same area are included in the Gr pixel and the Gb pixel. Accordingly, a difference in light absorption of the gate electrodes formed of polysilicon between the Gr pixel and the Gb pixel does not occur and a vertical stripe does not occur. Accordingly, it is possible to provide a solid-state imaging device having a 2-pixel shared structure, in which a difference in sensitivity between the shared pixels hardly occurs.

9. Seventh Embodiment

Configuration Example of Solid-State Imaging Device

Figure 16:
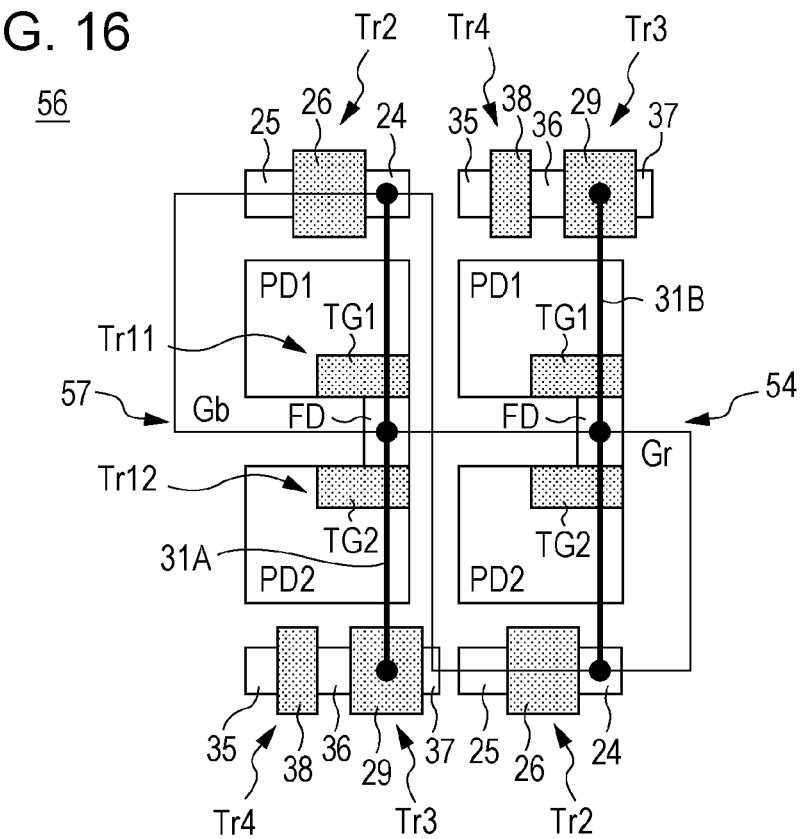
FIG. 16 is a configuration diagram of the main parts of a solid-state imaging device according to a seventh embodiment of the present invention.

FIG. 16 shows a solid-state imaging device, that is, a CMOS solid-state imaging device according to a seventh embodiment of the present invention. FIG. 16 shows the schematic configuration of main portions applied to the CMOS solid-state imaging device in which pixel transistors of the 4-transistor type are provided and a plurality of shared pixels having a 2-pixel shared structure is arranged. The arrangement of the pixel transistors and the like of the present embodiment will be described in comparison with Comparative Example 7 of FIG. 17.

Figure 25:
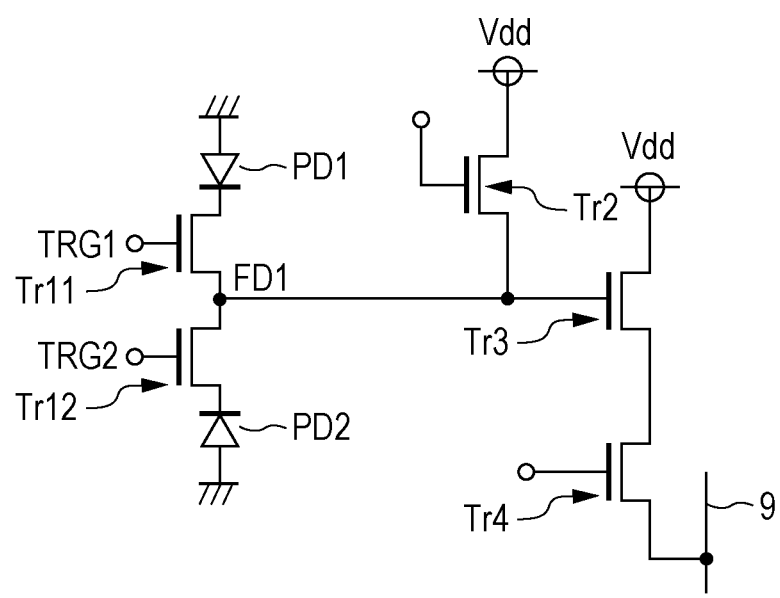
FIG. 25 is an equivalent circuit diagram of a 2-pixel shared structure of a 4-transistor type.

FIG. 25 shows an equivalent circuit of the shared pixels having pixel transistors of the 4-transistor type and the 2-pixel shared structure. The portions corresponding to FIG. 23 are denoted by the same reference numerals and the description thereof will be omitted.

Figure 17:
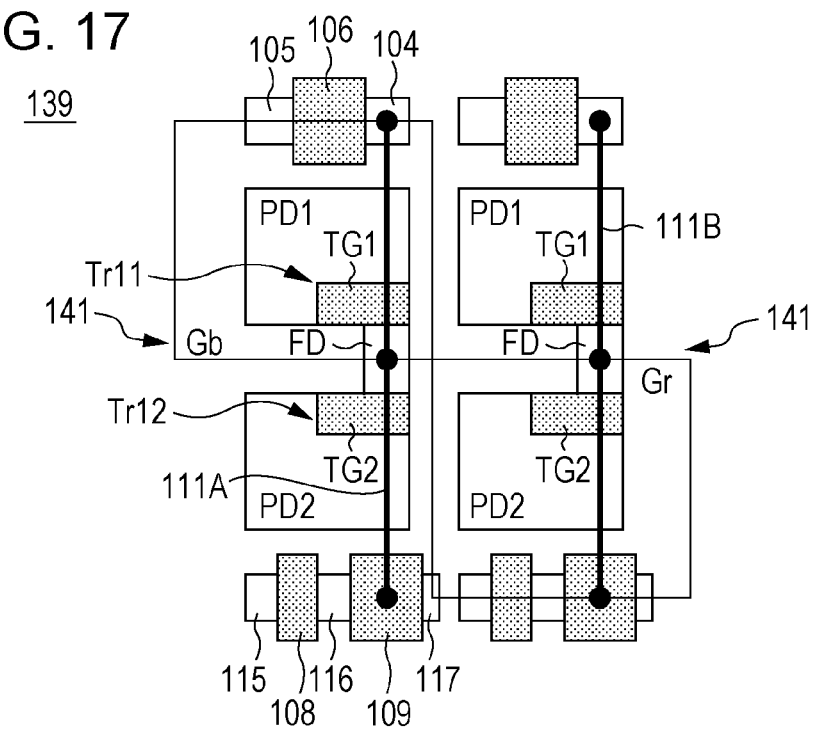
FIG. 17 is a configuration diagram of the main parts of a solid-state imaging device according to Comparative Example 7.

First, the solid-state imaging device according to Comparative Example 7 of FIG. 17 will be described. In the solid-state imaging device 139 of Comparative Example 7, a reset transistor Tr2 and a serial circuit of an amplification transistor Tr3 and a selection transistor Tr4 are divisionally arranged on the upper and lower sides of the shared pixels 141. The reset transistor Tr2 includes a source region 104, a drain region 105 and a reset gate electrode 106. The serial circuit of the amplification transistor Tr3 and the selection transistor Tr4 include three diffusion regions 115, 116 and 117 which become the source/drain regions, an amplification gate electrode 109 and a selection gate electrode 118. In the shared pixels 141 of the neighboring columns, the reset transistors Tr2 are arranged in the same direction and in the same row direction and the serial circuit of the amplification transistor Tr3 and the selection transistor Tr4 are arranged in the same direction and the same row direction. Since the other configuration is the same as that of FIG. 15, the portions corresponding to FIG. 15 are denoted by the same reference numerals and the description thereof will be omitted.

In the solid-state imaging device 139 of Comparative Example 7, the wiring length of the FD wirings 111A and 111B of the neighboring columns become equal. For example, in the case of using the color filters of the Bayer array, a portion of the reset gate electrode 106 is included in the Gr pixel and a portion of the amplification gate electrode 109 is included in the Gb pixel. Since the Gr pixel and the Gb pixel include the gate electrodes having different areas, a difference in light absorption of the gate electrodes between the Gr pixel and the Gb pixel occurs and, as a result, a deviation in sensitivity between columns occurs and a vertical stripe occurs.

Next, the solid-state imaging device according to the seventh embodiment will be described. In the solid-state imaging device 56 according to the seventh embodiment, a reset transistor Tr2 and a serial circuit of an amplification transistor Tr3 and a selection transistor Tr4 are divisionally arranged on the upper and lower sides of the shared pixels 57. Between the shared pixels of the neighboring columns, the reset transistors Tr2 are arranged so as to be vertically crossed and the serial circuits are arranged so as to be vertical crossed. That is, the reset transistors Tr2 and the serial circuits of the amplification transistor Tr3 and the selection transistors Tr4 corresponding to the neighboring columns are lined up and arranged in the row direction such that the array thereof is arranged so as to be crossed on the upper side and the lower side. The reset transistor Tr2 includes a source region 24, a drain region 25 and a reset gate electrode 26. The serial circuit of the amplification transistor Tr3 and the selection transistor Tr4 includes three diffusion regions 35, 36 and 37 which become the source/drain regions, an amplification gate electrode 29 and a selection gate electrode 38.

Since the other configuration is the same as that of FIG. 14, the portions corresponding to FIG. 14 are denoted by the same reference numerals and the description thereof will be omitted.

According to the solid-state imaging device 56 according to the seventh embodiment, in the 2-pixel shared configuration, the reset transistor Tr2 and the serial circuit of the amplification transistor Tr3 and the selection transistor Tr4 are arranged so as to be vertically crossed between the shared pixels 57 of the neighboring columns. By this configuration, the wiring length of the FD wiring 31A of the shared pixel 57 of the left column and the FD wiring 31B of the shared pixel 57 of the right column become equal. Accordingly, a difference in wiring capacitance between the FD wirings 31A and 31B does not occur and a difference in conversion efficiency between columns does not occur. As a result, a vertical stripe does not occur.

In the case of using the color filters of the Bayer array, by arranging the pixel transistors as described above, the gate electrodes having the same area are included in the Gr pixel and the Gb pixel. Accordingly, a difference in light absorption of the gate electrodes formed of polysilicon between the Gr pixel and the Gb pixel does not occur and a vertical stripe does not occur. Accordingly, it is possible to provide a solid-state imaging device having a 2-pixel shared structure, in which a difference in sensitivity between the shared pixels hardly occurs.

10. Eighth Embodiment

Configuration Example of Solid-State Imaging Device

Figure 18:
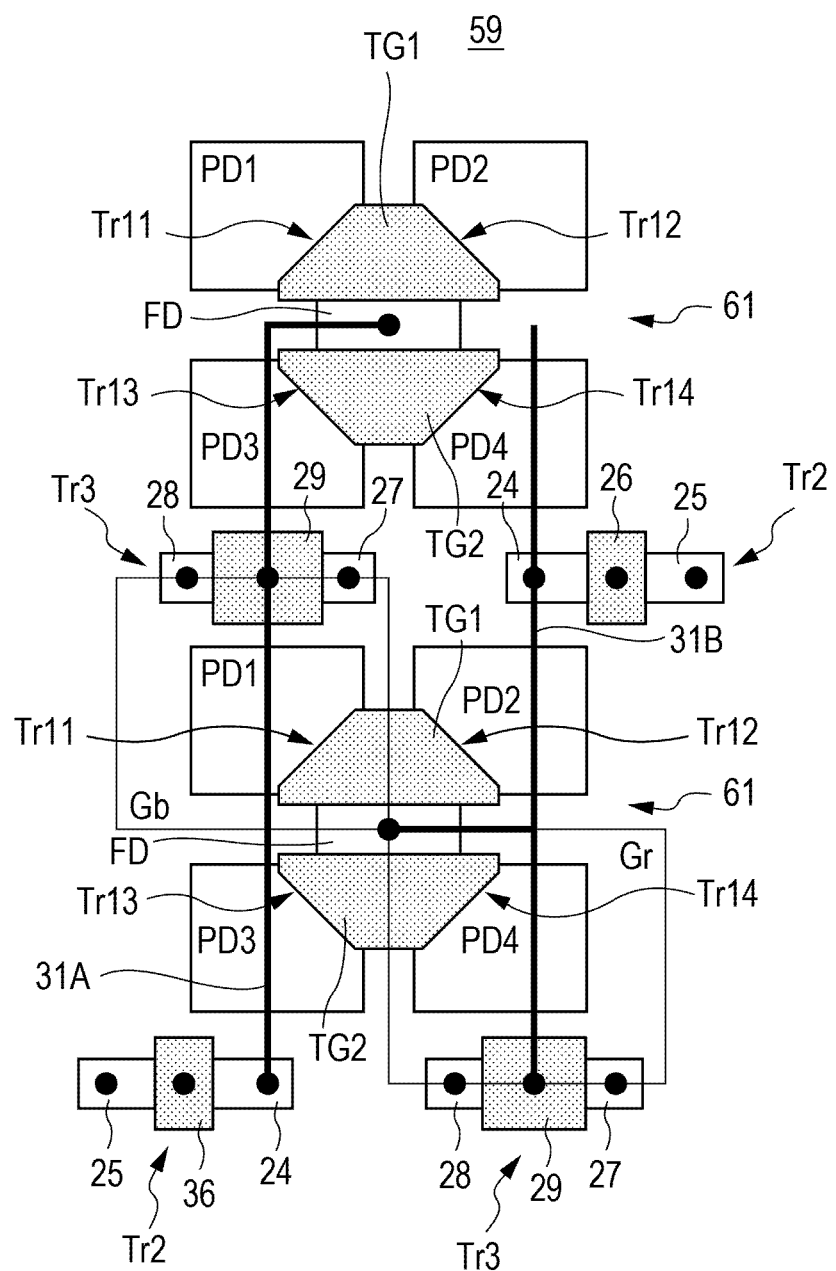
FIG. 18 is a configuration diagram of the main parts of a solid-state imaging device according to an eighth embodiment of the present invention.

FIG. 18 shows a solid-state imaging device, that is, a CMOS solid-state imaging device according to an eighth embodiment of the present invention. FIG. 18 shows the schematic configuration of main portions applied to the CMOS solid-state imaging device in which pixel transistors of the 3-transistor type are provided and a plurality of shared pixels having a 2×2 pixel shared structure, that is, a 4-pixel shared structure, is arranged. The arrangement of the pixel transistors and the like of the present embodiment will be described in comparison with Comparative Example 8 of FIG. 19.

Figure 26:
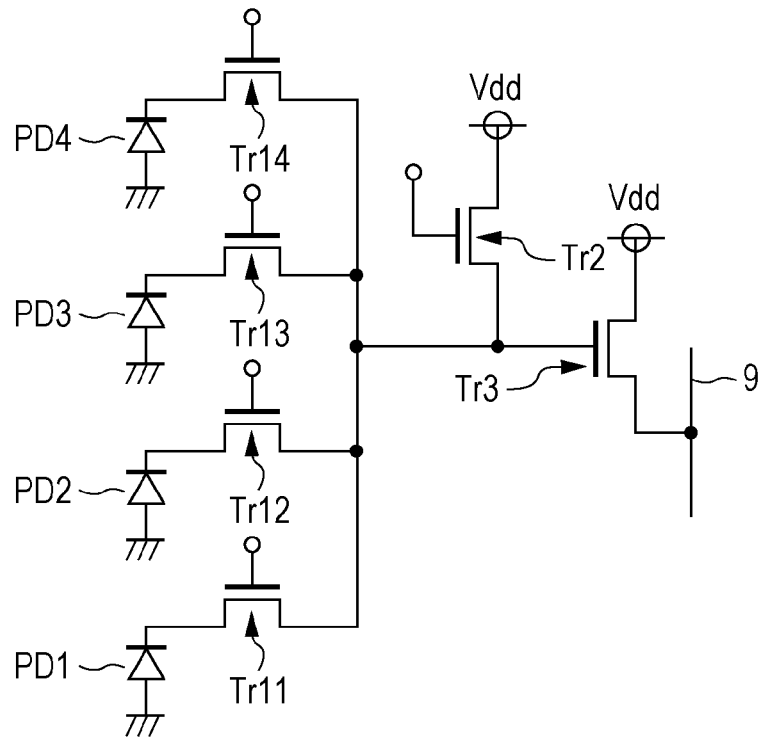
FIG. 26 is an equivalent circuit diagram of a 2×2-pixel shared structure, that is, a 4-pixel shared structure, of a 3-transistor type.

FIG. 26 shows an equivalent circuit of the shared pixels having pixel transistors of the 3-transistor type and the 2×2-pixel shared structure, that is, the 4-pixel shared structure. The portions corresponding to FIG. 22 are denoted by the same reference numerals and the description thereof will be omitted.

First, the solid-state imaging device according to Comparative Example 8 of FIG. 19 will be described. In the solid-state imaging device 143 of Comparative Example 8, one floating diffusion portion FD is shared between 2×2 photodiodes, that is, a total of four photodiodes PD [PD1 to PD4]. The pixel transistors are configured as the 3-transistor type of four transfer transistors Tr1 [Tr11 to Tr14], one reset transistor Tr2 and one amplification transistor Tr3. The shared pixels 144 having the 4-pixel shared structure are formed of the four photodiodes PD1 to PD4, one floating diffusion portion FD, the transfer transistors Tr11 to Tr14, the reset transistor Tr2 and the amplification transistor Tr3.

Among the four transfer transistors Tr11 to Tr14, the transfer gate electrodes of the transfer transistors Tr11 and Tr12 connected to two horizontal photodiodes PD1 and PD2 are formed of a common gate electrode TG1. The transfer gate electrodes of the transfer transistors Tr13 and Tr14 connected to two horizontal photodiodes PD3 and PD4 are formed of a common gate electrode TG2. The amplification transistor Tr3 and the reset transistor Tr2 are divisionally arranged on the upper side and the lower side of the shared pixels 144. In the vertically neighboring shared pixels 144, the reset transistors Tr2 are arranged in the same row direction. The amplification transistors Tr3 are arranged in the same row direction.

The reset transistor Tr2 includes a source region 104, a drain region 105 and a reset gate electrode 106. The amplification transistor Tr3 includes a source region 107, a drain region 108 and an amplification gate electrode 109. In the shared pixels, the floating diffusion portion FD, the amplification gate electrode 109 and the source region 104 of the reset transistor are connected by the FD wirings 111 [111A and 111B].

In the solid-state imaging device 143 of Comparative Example 8, the FD wirings 111A and 111B of the vertically neighboring shared pixels 144 are formed along the column direction and the wiring lengths thereof become equal. For example, in the case of using the color filters of the Bayer array, a portion of the reset gate electrode 106 is included in the Gr pixel and a portion of the amplification gate electrode 109 is included in the Gb pixel. Since the Gr pixel and the Gb pixel include respective gate electrodes having different areas, a difference in light absorption of the gate electrodes between the Gr pixel and the Gb pixel occurs. As a result, a deviation in sensitivity between columns occurs and a vertical stripe occurs.

Next, the solid-state imaging device according to the eighth embodiment will be described. The solid-state imaging device 59 according to the eighth embodiment is configured by sharing one floating diffusion portion FD among the 2×2 photodiodes, that is, a total of four photodiodes PD [PD1 to PD4], as shown in FIG. 18. The pixel transistors are configured as the 3-transistor type of the four transfer transistors Tr1 [Tr11 to Tr14], one reset transistor Tr2 and one amplification transistor Tr3. The shared pixels 61 having the 4-pixel shared structure are formed of the four photodiodes PD1 to PD4, one floating diffusion portion FD, the transfer transistors Tr11 to Tr14, the reset transistor Tr2 and the amplification transistor Tr3.

Among the four transfer transistors Tr11 to Tr14, the transfer gate electrodes of the transfer transistors Tr11 and Tr12 connected to two horizontal photodiodes PD1 and PD2 are formed of a common gate electrode TG1. The transfer gate electrodes of the transfer transistors Tr13 and Tr14 connected to two horizontal photodiodes PD3 and PD4 are formed of a common gate electrode TG2.

In the present embodiment, the two vertically neighboring shared pixels are set as one and the reset transistor Tr2 and the amplification transistor Tr3 are divisionally arranged on the upper and lower sides in one set of shared pixels with the shared pixel 61 interposed therebetween. In one set, the reset transistor Tr2 and the amplification transistor Tr3 lined up and arranged in the row direction so as to correspond to two shared pixels 61 are arranged such that the arrays thereof are crossed on the upper side and the lower side. The reset transistor Tr2 includes a source region 34, a drain region 35 and a reset gate electrode 36. The amplification transistor Tr3 includes a source region 27, a drain region 28 and an amplification gate electrode 29.

In the shared pixels 61, the FD wirings 31 [31A and 31B] are electrically connected to the source region 24 of the reset transistor Tr2, the floating diffusion portion FD and the amplification gate electrode 29. The FD wirings 31A and 31B of the two vertically neighboring shared pixels 61 are arranged along the column direction.

According to the solid-state imaging device 59 according to the eighth embodiment, the reset transistor Tr2 and the amplification transistor Tr3 lined up and arranged in the row direction are arranged so as to be vertically crossed with the shared pixels 61 interposed therebetween. Accordingly, the wiring lengths of the FD wiring 31A and 31B of the vertically neighboring shared pixels 61 become equal. Accordingly, a difference in wiring capacitance between the FD wirings 31A and 31B does not occur and a difference in conversion efficiency between columns does not occur. As a result, a vertical stripe does not occur.

In the case of using the color filters of the Bayer array, by arranging the pixel transistors as described above, the gate electrodes having the same area are included in the Gr pixel and the Gb pixel. Accordingly, a difference in light absorption of the gate electrodes formed of polysilicon between the Gr pixel and the Gb pixel does not occur and a vertical stripe does not occur. Accordingly, it is possible to provide a solid-state imaging device having a 2-pixel shared structure, in which a difference in sensitivity between the shared pixels hardly occurs.

11. Ninth Embodiment

Configuration Example of Solid-State Imaging Device

Figure 20:
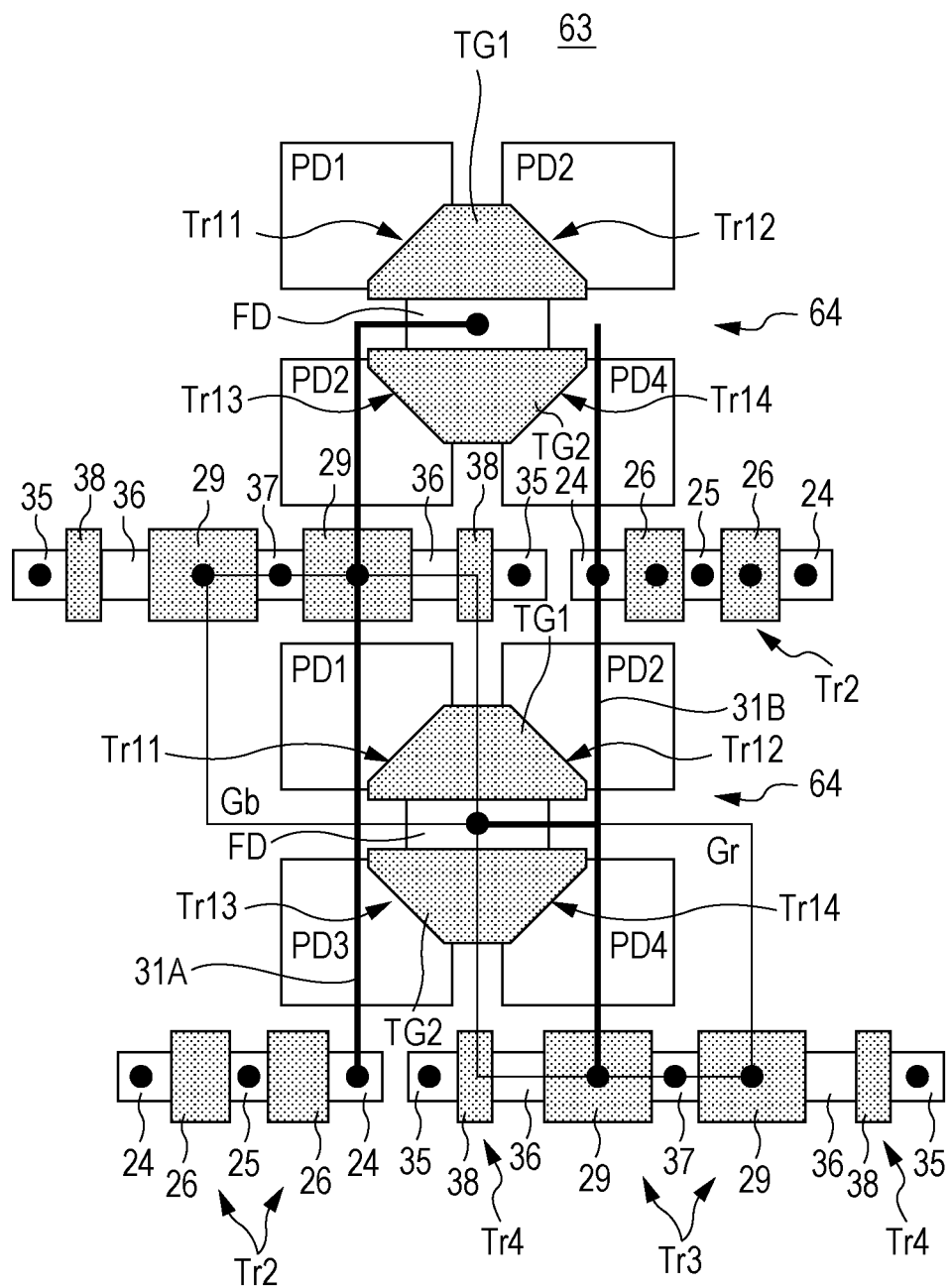
FIG. 20 is a configuration diagram of the main parts of a solid-state imaging device according to a ninth embodiment of the present invention.

FIG. 20 shows a solid-state imaging device, that is, a CMOS solid-state imaging device according to a ninth embodiment of the present invention. FIG. 20 shows the schematic configuration of main portions applied to the CMOS solid-state imaging device in which pixel transistors of the 4-transistor type are provided and a plurality of shared pixels having a 2×2 pixel shared structure, that is, a 4-pixel shared structure, is arranged. The arrangement of the pixel transistors and the like of the present embodiment will be described in comparison with Comparative Example 9 of FIG. 21.

Figure 27:
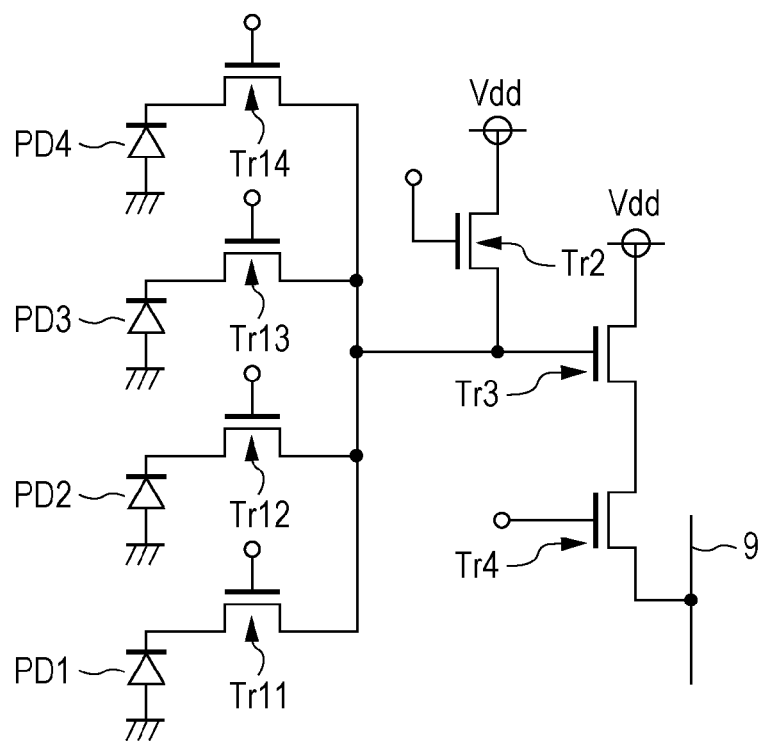
FIG. 27 is an equivalent circuit diagram of a 2×2-pixel shared structure, that is, a 4-pixel shared structure, of a 4-transistor type.

FIG. 27 shows an equivalent circuit of the shared pixels having pixel transistors of the 4-transistor type and the 2×2-pixel shared structure, that is, the 4-pixel shared structure. The portions corresponding to FIG. 23 are denoted by the same reference numerals and the description thereof will be omitted.

Figure 21:
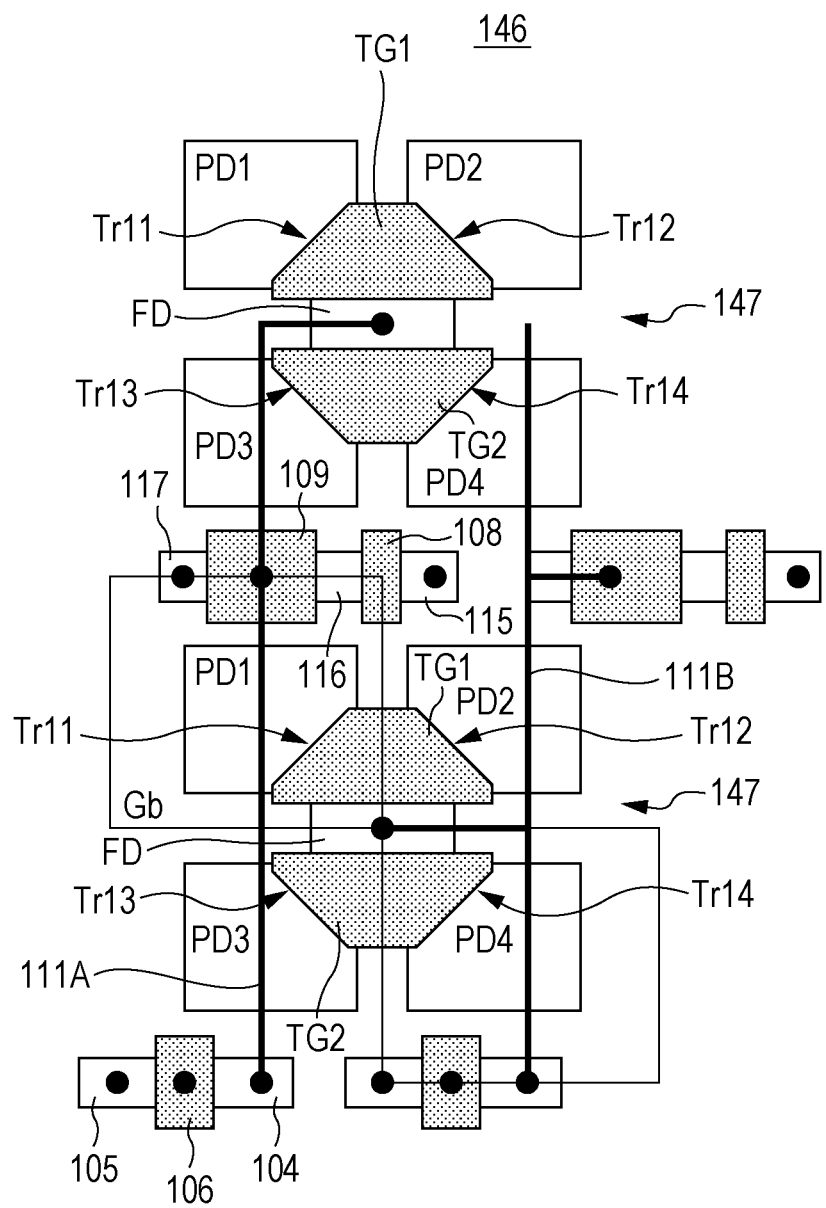
FIG. 21 is a configuration diagram of the main parts of a solid-state imaging device according to Comparative Example 9.

First, the solid-state imaging device according to Comparative Example 9 of FIG. 21 will be described. In the solid-state imaging device 146 of Comparative Example 9, a serial circuit of an amplification transistor Tr3 and a selection transistor Tr4 and a reset transistor Tr2 are divisionally arranged on the upper and lower sides with one shared pixel of the two vertically neighboring shared pixels 147 interposed therebetween. Two reset transistors Tr2 corresponding to the two shared pixels 64 are lined up and arranged in the same row direction. Two serial circuits corresponding to the two shared pixels 64 are lined up and arranged in the same row direction. The configuration of the serial circuit of the amplification transistor Tr3 and the selection transistor Tr4 is the same as that of FIG. 13 described above.

Figure 19:
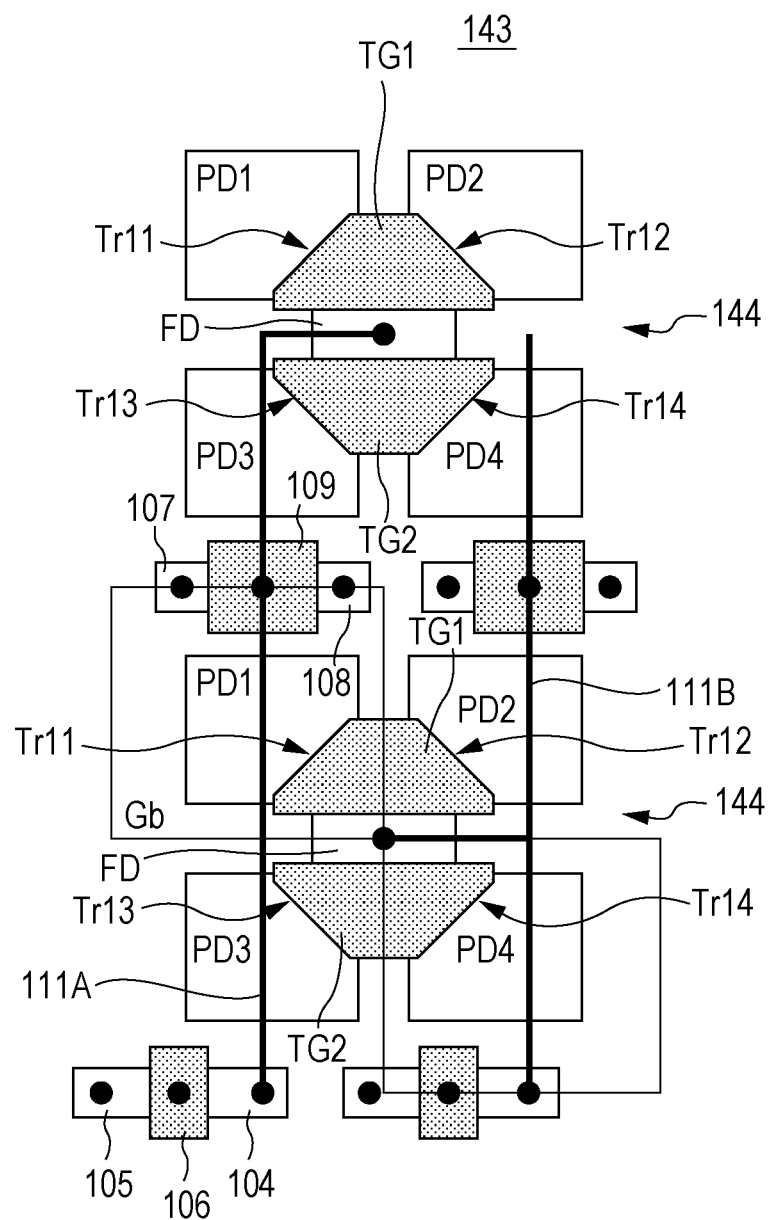
FIG. 19 is a configuration diagram of the main parts of a solid-state imaging device according to Comparative Example 8.

Since the other configuration is the same as that of FIG. 19, the portions corresponding to FIG. 19 are denoted by the same reference numerals and the description thereof will be omitted.

In the solid-state imaging device 146 of Comparative Example 9, the FD wirings 111A and 111B of the vertically neighboring shared pixels 147 are formed along the column direction and the wiring lengths thereof become equal. For example, in the case of using the color filters of the Bayer array, a portion of the reset gate electrode 106 is included in the Gr pixel and a portion of the amplification gate electrode 109 and the selection gate electrode 118 is included in the Gb pixel. Since the Gr pixel and the Gb pixel include respective gate electrodes having different areas, a difference in light absorption of the gate electrodes between the Gr pixel and the Gb pixel occurs. As a result, a deviation in sensitivity between columns occurs and a vertical stripe occurs.

Next, the solid-state imaging device according to the ninth embodiment will be described. In the solid-state imaging device 63 according to the ninth embodiment, as shown in FIG. 20, the serial circuit of the amplification transistor Tr3 and the selection transistor Tr4 and the reset transistor Tr2 are horizontally reversed in the vertically neighboring shared pixels. The horizontally reversed serial circuit and the reset transistor Tr2 are arranged so as to be vertically crossed. That is, two reset transistors Tr2 in which the drain region 25 is commonly integrated and two serial circuits in which the drain region of the amplification transistor Tr3 is commonly integrated are arranged in the row direction on the upper side of the vertically neighboring shared pixel 64. The integrated reset transistor Tr2 and the serial circuit are arranged on the lower side of the vertically neighboring shared pixel 64 so as to become the array crossing the array of the integrated serial circuit and reset transistor Tr2. The configuration of the integrated serial circuit and the integrated reset transistor Tr2 is the same as that described in FIG. 5.

Since the other configuration is the same as that of FIG. 8, the portions corresponding to FIG. 8 are denoted by the same reference numerals and the description thereof will be omitted.

According to the solid-state imaging device 63 according to the ninth embodiment, since the serial circuits and the reset transistors Tr2 of the vertically neighboring two shared pixels 64 are arranged so as to be horizontally reversed and vertically crossed, the wiring lengths of the FD wirings 31A and 31B of the vertically neighboring shared pixels 61 become equal. Accordingly, a difference in wiring capacitance between the FD wirings 31A and 31B does not occur and a difference in conversion efficiency between columns does not occur. As a result, a vertical stripe does not occur.

In the case of using the color filters of the Bayer array, by arranging the pixel transistors as described above, the gate electrodes having the same area are included in the Gr pixel and the Gb pixel. Accordingly, a difference in light absorption of the gate electrodes formed of polysilicon between the Gr pixel and the Gb pixel does not occur and a vertical stripe does not occur. Accordingly, it is possible to provide a solid-state imaging device having a 2-pixel shared structure, in which a difference in sensitivity between the shared pixels hardly occurs.

The solid-state imaging devices according to the above-described embodiments of the present invention are applicable to a front-illuminated type or a back-illuminated type.

12. Tenth Embodiment

Configuration Example of Electronic Apparatus

The above-described solid-state imaging devices according to the present invention are applicable to, for example, electronic apparatuses, such as digital still cameras, digital video cameras, various mobile terminals such as mobile telephones including a camera included therein, printers or the like.

Figure 28:
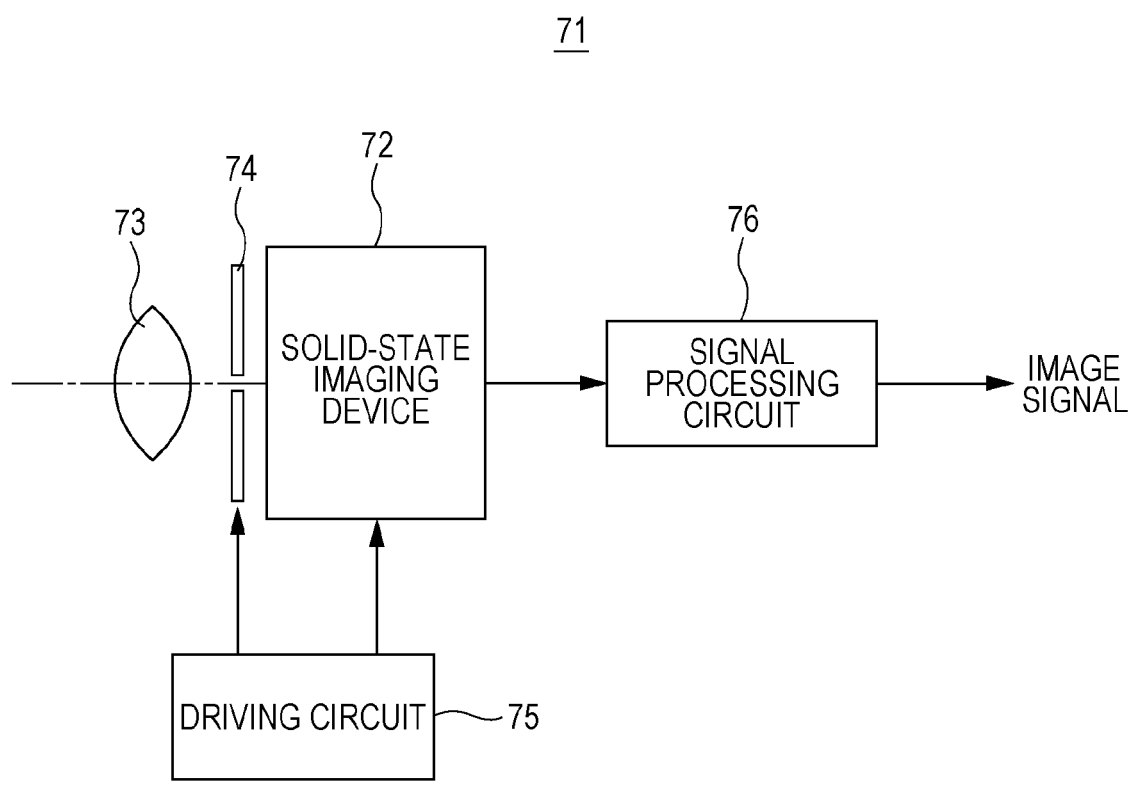
FIG. 28 is a schematic configuration diagram of an electronic apparatus according to the present invention.
Figure 29:
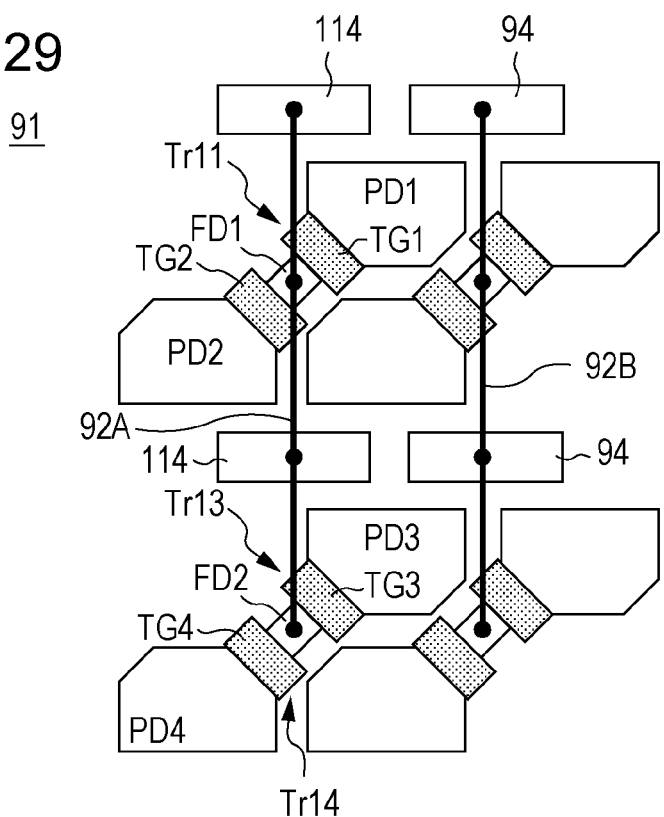
FIG. 29 is a configuration diagram of the main parts of a solid-state imaging device of a zigzag 4-pixel shared structure of the related art.
Figure 30:
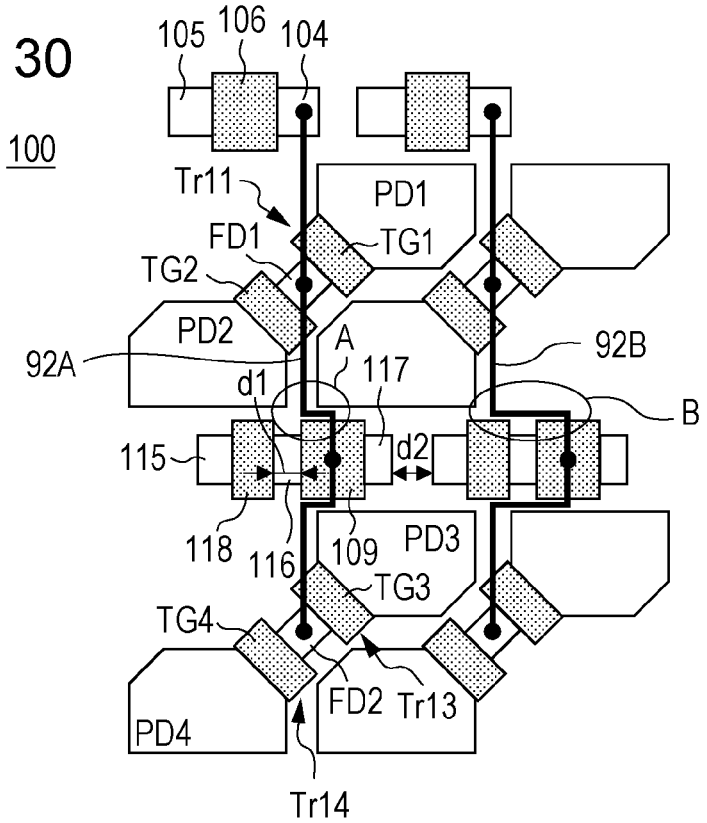
FIG. 30 is a configuration diagram of the main parts of a solid-state imaging device of a zigzag 4-pixel shared structure of the related art.
Figure 31:
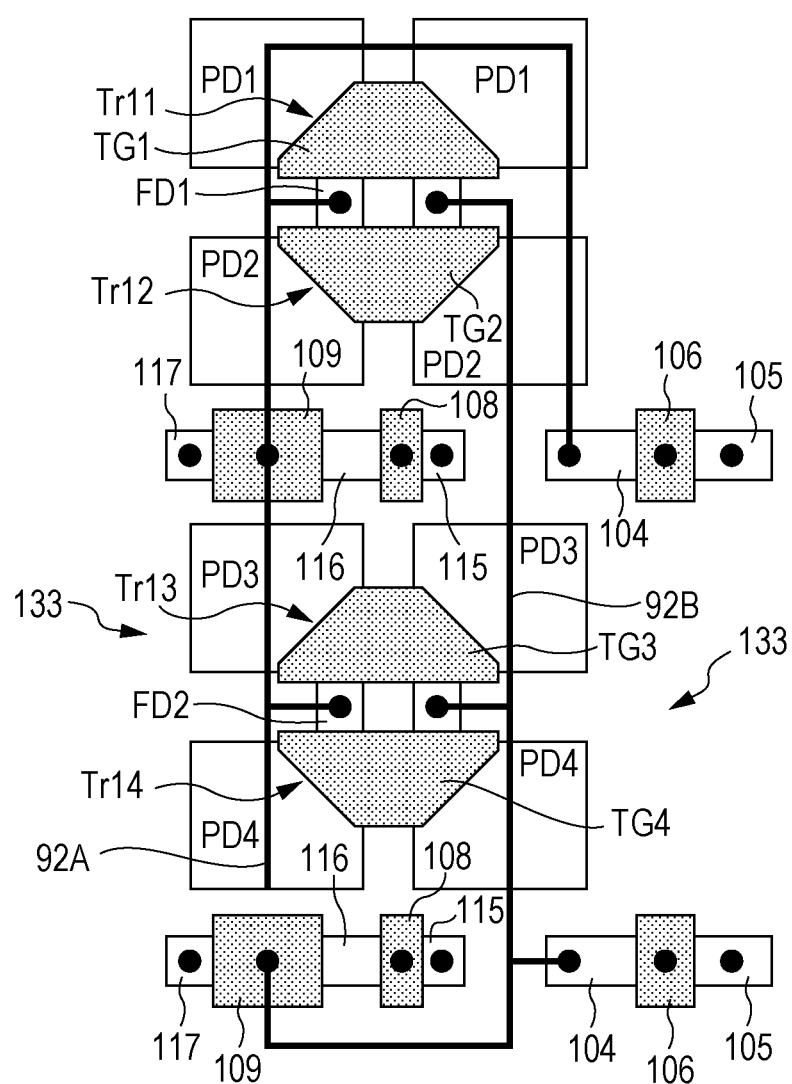
FIG. 31 is a configuration diagram of the main parts of a solid-state imaging device of a 3-transistor type of longitudinal 4-pixel shared structure of the related art.
Figure 32:
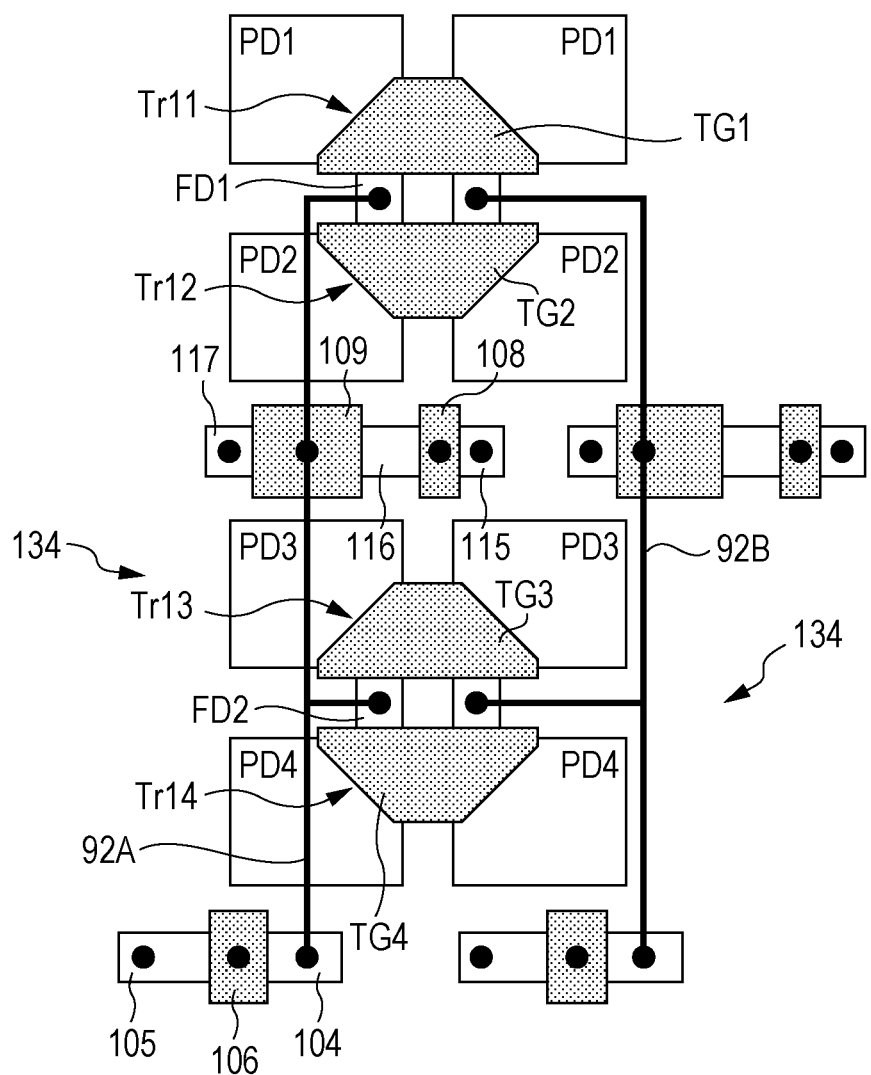
FIG. 32 is a configuration diagram of the main parts of a solid-state imaging device of a 4-transistor type of longitudinal 4-pixel shared structure of the related art.

FIG. 28 shows a camera, which is an example of an electronic apparatus, according to a tenth embodiment of the present invention. The camera according to the present embodiment is, for example, a video camera capable of photographing a still image or a moving image. The camera 71 of the present embodiment includes a solid-state imaging device 72, an optical system 73 for guiding incident light to a light-receiving sensor unit of the solid-state imaging device 72, and a shutter device 74. The camera 71 further includes a driving circuit 75 for driving the solid-state imaging device 72 and a signal processing circuit 76 for processing an output signal of the solid-state imaging device 72.

As the solid-state imaging device 72, any one of the solid-state imaging devices of the above-described embodiments is applied. The optical system (optical lens) 73 images image light (incident light) from a subject on a imaging surface of the solid-state imaging device 72 and the optical system 73 may be an optical lens system including a plurality of optical lenses. The shutter device 74 controls a light irradiation period and a light shielding period of the solid-state imaging device 72. The driving circuit 75 supplies a driving signal for controlling a transmission operation of the solid-state imaging device 72 and a shutter operation of the shutter device 74. Signal transmission of the solid-state imaging device 72 is performed by the driving signal (timing signal) supplied from the driving circuit 75. The signal processing circuit 76 performs a variety of signal processes. A signal-processed image signal is stored in a storage medium such as a memory or is output to a monitor.

According to the electronic apparatus such as the camera according to the tenth embodiment, in the solid-state imaging device 72 having shared pixels, since a difference in sensitivity between the shared pixels hardly occurs, it is possible to obtain high quality and to provide an electronic apparatus with high reliability.

The present application contains subject matter related to that disclosed in Japanese Priority Patent Application JP 2010-017019 filed in the Japan Patent Office on Jan. 28, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
 a first pixel including:
  a first plurality of photoelectric conversion portions;
  a first transistor portion shared by the first plurality of photoelectric conversion portions, the first transistor portion including a first reset transistor, a first amplification transistor, and a first selection transistor; and
 a second pixel including:
  a second plurality of photoelectric conversion portions;
  a second transistor portion shared by the second plurality of photoelectric conversion portions, the second transistor portion including a second reset transistor, a second amplification transistor, and a second selection transistor,
 wherein the first selection transistor, the first amplification transistor, the second amplification transistor, and the second selection transistor are adjacent one another in a first row in this order, and
 wherein the first reset transistor and the second reset transistor are disposed in a second row.

2. The solid-state imaging device according to claim 1, wherein the first plurality of photoelectric conversion portions includes a first photodiode and a second photodiode, and the second plurality of photoelectric conversion portions includes a third photodiode and a fourth photodiode.

3. The solid-state imaging device according to claim 2, wherein the first photodiode and the third photodiode are disposed in a third row, and the third row is disposed between the first row and the second row.

4. The solid-state imaging device according to claim 1, wherein
 the first selection transistor comprises a first selection source region connected to a first vertical signal line at a first signal connection point,
 the second selection transistor comprises a second selection source region connected to a second vertical signal line at a second signal connection point, and
 the first amplification transistor and the second amplification transistor are disposed between the first signal connection point and the second signal connection point in the first row.

5. The solid-state imaging device according to claim 1, wherein
 the first amplification transistor comprises a first amplification drain region connected to a power source at a first power connection point,
 the second amplification transistor comprises a second amplification drain region connected to the power source at the first power connection point, and the first power connection point is disposed between the first amplification transistor and the second amplification transistor in the first row.

6. An electronic apparatus comprising:
a solid-state imaging device;
an optical system configured to guide incident light to the solid-state imaging device; and
a signal processing circuit configured to process an output signal of the solid-state imaging device,
wherein the solid-state imaging device includes:
  a first pixel including:
    a first plurality of photoelectric conversion portions;
    a first transistor portion shared by the first plurality of photoelectric conversion portions, the first transistor portion including a first reset transistor, a first amplification transistor, and a first selection transistor; and
  a second pixel including:
    a second plurality of photoelectric conversion portions;
    a second transistor portion shared by the second plurality of photoelectric conversion portions, the second transistor portion including a second reset transistor, a second amplification transistor, and a second selection transistor,
wherein the first selection transistor, the first amplification transistor, the second amplification transistor, and the second selection transistor are adjacent one another in a first row in this order, and
wherein the first reset transistor and the second reset transistor are disposed in a second row.

7. The electronic apparatus according to claim 6, wherein the first plurality of photoelectric conversion portions includes a first photodiode and a second photodiode, and the second plurality of photoelectric conversion portions includes a third photodiode and a fourth photodiode.

8. The electronic apparatus according to claim 7, wherein the first photodiode and the third photodiode are disposed in a third row, and the third row is disposed between the first row and the second row.

9. The electronic apparatus according to claim 6, wherein
the first selection transistor comprises a first selection source region connected to a first vertical signal line at a first signal connection point,
the second selection transistor comprises a second selection source region connected to a second vertical signal line at a second signal connection point, and
the first amplification transistor and the second amplification transistor are disposed between the first signal connection point and the second signal connection point in the first row.

10. The electronic apparatus according to claim 6, wherein
the first amplification transistor comprises a first amplification drain region connected to a power source at a first power connection point,
the second amplification transistor comprises a second amplification drain region connected to the power source at the first power connection point, and
the first power connection point is disposed between the first amplification transistor and the second amplification transistor in the first row.

* * * * *